United States Patent
Cho et al.

(10) Patent No.: US 9,812,596 B2
(45) Date of Patent: Nov. 7, 2017

(54) PHOTOELECTRIC DEVICE AND ELECTRONIC APPARATUS INCLUDING THE SAME

(71) Applicant: SAMSUNG ELECTRONICS CO., LTD., Suwon-si (KR)

(72) Inventors: Kyungsang Cho, Gwacheon-si (KR); Chanwook Baik, Yongin-si (KR); Heejeong Jeong, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/198,788

(22) Filed: Jun. 30, 2016

(65) Prior Publication Data

US 2017/0084761 A1    Mar. 23, 2017

(30) Foreign Application Priority Data

Sep. 17, 2015 (KR) .......................... 10-2015-0131892

(51) Int. Cl.
*H01L 31/0232* (2014.01)
*H01L 31/032* (2006.01)
(Continued)

(52) U.S. Cl.
CPC .. *H01L 31/02322* (2013.01); *H01L 27/14647* (2013.01); *H01L 31/032* (2013.01);
(Continued)

(58) Field of Classification Search
CPC ............. H01L 31/02322; H01L 31/032; H01L 27/14647; H01L 31/023022;
(Continued)

(56) References Cited

U.S. PATENT DOCUMENTS 6,400,744 B1    6/2002  Capasso et al.
6,501,783 B1   12/2002  Capasso et al.
(Continued)

FOREIGN PATENT DOCUMENTS

JP   2005-26567 A    1/2005
JP   2013-506302 A   2/2013
(Continued)

OTHER PUBLICATIONS

InVisage Technology; http://www.invisage.com/technology/; Mar. 24, 2016; 16 pgs. total.

(Continued)

*Primary Examiner* — Caridad Everhart
(74) *Attorney, Agent, or Firm* — Sughrue Mion, PLLC

(57) ABSTRACT

Provided are photoelectric devices and electronic apparatuses including the photoelectric devices. A photoelectric device may include a photoactive layer, the photoactive layer may include a nanostructure layer configured to generate a charge in response to light and a semiconductor layer adjacent to the nanostructure layer. The nanostructure layer may include one or more quantum dots. The semiconductor layer may include an oxide semiconductor. The photoelectric device may include a first electrode and a second electrode that contact different regions of the photoactive layer. A number of the photoelectric conversion elements may be arranged in a horizontal direction or may be stacked in a vertical direction. The photoelectric conversion elements may absorb and thereby detect light in different wavelength bands without the use of color filters.

40 Claims, 45 Drawing Sheets

(51) Int. Cl.
    *H01L 31/12*      (2006.01)
    *H01L 27/146*     (2006.01)
    *H01L 31/112*     (2006.01)
    *H01L 31/0352*    (2006.01)
    *B82Y 20/00*      (2011.01)

(52) U.S. Cl.
    CPC .. *H01L 31/035218* (2013.01); *H01L 31/1126* (2013.01); *B82Y 20/00* (2013.01); *Y10S 977/774* (2013.01); *Y10S 977/954* (2013.01)

(58) Field of Classification Search
    CPC ......... H01L 31/1126; H01L 31/035218; B82Y 20/00; Y10S 977/724; Y10S 977/954; Y10S 977/774
    See application file for complete search history.

(56) References Cited

U.S. PATENT DOCUMENTS

| | | | |
|---|---|---|---|
| 8,846,418 B2 | 9/2014 | Kim et al. | |
| 9,054,262 B2 | 6/2015 | Lewis et al. | |
| 2002/0101895 A1* | 8/2002 | Augusto | B82Y 20/00 372/44.01 |
| 2003/0160176 A1* | 8/2003 | Vispute | H01L 31/022408 250/372 |
| 2007/0120045 A1* | 5/2007 | Yokoyama | H01L 27/307 250/214 R |
| 2007/0137693 A1 | 6/2007 | Forrest | |
| 2007/0215858 A1 | 9/2007 | Uchiyama et al. | |
| 2007/0215860 A1 | 9/2007 | Komiyama et al. | |
| 2010/0097611 A1 | 4/2010 | Song | |
| 2010/0141318 A1 | 6/2010 | Suzuki | |
| 2011/0290311 A1* | 12/2011 | Fukada | H01L 31/04 136/255 |
| 2011/0297217 A1 | 12/2011 | Barkhouse et al. | |
| 2011/0309236 A1 | 12/2011 | Tian et al. | |
| 2011/0315898 A1 | 12/2011 | Capasso et al. | |
| 2012/0025185 A1 | 2/2012 | Kasamatsu | |
| 2012/0111398 A1* | 5/2012 | Suto | H01L 31/035218 136/255 |
| 2012/0280208 A1* | 11/2012 | Jain | B82Y 10/00 257/20 |
| 2013/0070459 A1 | 3/2013 | Kim et al. | |
| 2013/0070799 A1 | 3/2013 | Lee et al. | |
| 2014/0061486 A1 | 3/2014 | Bao et al. | |
| 2014/0291608 A1 | 10/2014 | Sargent et al. | |
| 2015/0117015 A1 | 4/2015 | Roh et al. | |
| 2015/0123079 A1 | 5/2015 | Kim et al. | |
| 2015/0138412 A1 | 5/2015 | Ovsiannikov et al. | |
| 2015/0325438 A1 | 11/2015 | Cho | |
| 2016/0020352 A1* | 1/2016 | Konstantatos | H01L 31/035218 257/24 |
| 2017/0084761 A1 | 3/2017 | Cho et al. | |

FOREIGN PATENT DOCUMENTS

| | | |
|---|---|---|
| KR | 10-2013-0026874 A | 3/2013 |
| KR | 10-2015-0142374 A | 12/2015 |

OTHER PUBLICATIONS

Jie Bao et al; "A colloidal quantum dot spectrometer"; Research Letter; Nature; Jul. 2, 2015; vol. 523; 16 pgs. total.

Mi Young Park, et al., "Chromaticity(b*), Sheet Resistance and Transmittance of $SiO_2$-ITO Thin Films Deposited on PET Film by Using Roll-to-Roll Sputter System", Kor. J. Mater. Res., vol. 21, No. 5, 2011, pp. 255-262.

Gerasimos Konstantatos, et al., "Hybrid graphene-quantum dot phototransistors with ultrahigh gain", Nature Nanotechnology, vol. 7, June 2012, Letters, pp. 363-368.

Gerasimos Konstantatos, et al., "Ultrasensitive solution-cast quantum dot photodetectors", Nature, vol. 442, Jul. 13, 2006, Letters, pp. 180-183.

Communication dated Feb. 2, 2017, issued by the European Patent Office in counterpart European Application No. 16186181.0.

* cited by examiner

PHOTOELECTRIC DEVICE AND ELECTRONIC APPARATUS INCLUDING THE SAME

CROSS-REFERENCE TO RELATED APPLICATION

This application claims priority from Korean Patent Application No. 10-2015-0131892, filed on Sep. 17, 2015, in the Korean Intellectual Property Office, the disclosure of which is incorporated herein in its entirety by reference.

BACKGROUND

1. Field

Apparatuses consistent with exemplary embodiments relate to photoelectric devices and electronic apparatuses including the same.

2. Description of the Related Art

Photoelectric devices convert optical energy into electrical energy and generate electrical signals or power in response to light such as visible rays, infrared rays, and ultraviolet rays. Photodiodes and solar cells are examples of photoelectric devices.

Photoelectric devices may be utilized in image sensors, photosensors, or the like. Red, green, and blue (RGB) pixels may be used in complementary metal-oxide semiconductor (CMOS) image sensors, RGB photosensors, or the like. Typically, a color filter corresponding to each subpixel is used to implement an RGB pixel. However, when color filters are used, image blur may occur due to light crossover or light scattering. Also, when the degree of integration and resolution of a device increase, the size of a photoelectric device in a pixel is reduced, and various limits and problems may be caused, such as fill factor reduction and optical gain reduction.

SUMMARY

One or more exemplary embodiments may provide are photoelectric devices that may actively determine a wavelength band of an absorbed (detected) light. One or more exemplary embodiments may provide photoelectric devices that have excellent photoelectric conversion characteristics and carrier (charge) transfer characteristics.

One or more exemplary embodiments may provide photoelectric devices that have a high responsivity and a high detectivity. One or more exemplary embodiments may provide photoelectric devices that have a high optical gain and a high sensitivity. One or more exemplary embodiments may provide photoelectric devices that may be easily capable of high integration and high resolution.

One or more exemplary embodiments may provide photoelectric devices that may realize an RGB pixel without a color filter. One or more exemplary embodiments may provide photoelectric devices wherein a pixel size in a horizontal direction may be greatly reduced by stacking subpixels in a vertical direction.

One or more exemplary embodiments may provide photoelectric devices that may be applied to transparent devices.

One or more exemplary embodiments may provide photoelectric devices that may be applied to flexible devices.

One or more exemplary embodiments may provide electronic apparatuses that include the photoelectric devices.

Additional exemplary aspects and advantages will be set forth in part in the description which follows and, in part, will be apparent from the description, or may be learned by practice of the presented exemplary embodiments.

According to an aspect of an exemplary embodiment, a photoelectric device for converting optical energy into electrical energy includes: a photoactive layer including a quantum dot layer configured to generate a charge in response to light and a semiconductor layer configured to provide a channel for conducting the charge generated by the quantum dot layer; and first and second electrodes contacting opposite ends of the channel of the photoactive layer, respectively.

The semiconductor layer may include an oxide semiconductor.

The oxide semiconductor may include at least one of a zinc oxide (ZnO)-based oxide, an indium oxide (InO)-based oxide, and a tin oxide (SnO)-based oxide.

The oxide semiconductor may include, for example, at least one of a silicon indium zinc oxide (SIZO), a silicon zinc tin oxide (SZTO), a zinc oxide (ZnO), an indium zinc oxide (IZO), a zinc tin oxide (ZTO), a gallium indium zinc oxide (GIZO), a hafnium indium zinc oxide (HIZO), an indium zinc tin oxide (IZTO), a tin oxide (SnO), an indium tin oxide (ITO), an indium gallium oxide (IGO), an indium oxide (InO), and an aluminum indium oxide (AIO).

The semiconductor layer may have an energy band gap of about 3.0 eV to about 5.0 eV.

The photoactive layer may have a structure in which the quantum dot layer is embedded in the semiconductor layer.

The semiconductor layer may include a lower semiconductor layer and an upper semiconductor layer, and the quantum dot layer may be provided between the lower semiconductor layer and the upper semiconductor layer.

The lower semiconductor layer and the upper semiconductor layer may have different thicknesses.

A plurality of quantum dots constituting the quantum dot layer may include at least one of a II-VI group-based semiconductor, a III-V group-based semiconductor, a IV-VI group-based semiconductor, a IV group-based semiconductor, and a graphene quantum dot.

Each of a plurality of quantum dots constituting the quantum dot layer may have a core-shell structure or a shell-less particle structure, and the core-shell structure may be a single-shell structure or a multi-shell structure.

A wavelength band of light absorbed by the quantum dot layer may be dependent on the materials, configurations, and/or sizes of a plurality of quantum dots constituting the quantum dot layer.

The first and second electrodes may be spaced apart from each other in a direction parallel to the photoactive layer.

The photoelectric device may be a phototransistor, and in this case, the photoelectric device may further include a gate electrode configured to apply an electric field to the photoactive layer.

The photoelectric device may be a photodetector or a photovoltaic device.

According to an aspect of another exemplary embodiment, an electronic apparatus includes one or more photoelectric devices described above.

According to an aspect of another exemplary embodiment, a photoelectric device includes: a plurality of photoelectric conversion elements configured to convert optical energy into electrical energy, wherein the photoelectric conversion elements include at least first and second photoelectric conversion elements, the first photoelectric conversion element includes a first photoactive layer between first and second electrodes and the first photoactive layer includes a first quantum dot layer configured to generate a charge in response to light and a first semiconductor layer configured to provide a channel for conducting the charge generated by the first quantum dot layer, the second photoelectric conversion element includes a second photoactive layer between third and fourth electrodes and the second photoactive layer includes a second quantum dot layer generating a charge in response to light and a second semiconductor layer providing a channel for conducting the charge generated by the second quantum dot layer, and the first quantum dot layer and the second quantum dot layer are configured to absorb light of different wavelength bands without the use of color filters corresponding thereto.

The photoelectric conversion elements may further include a third photoelectric conversion element, the third photoelectric conversion element may include a third photoactive layer between fifth and sixth electrodes and the third photoactive layer may include a third quantum dot layer configured to generate a charge in response to light and a third semiconductor layer configured to provide a channel for conducting the charge generated by the third quantum dot layer, and the third quantum dot layer may be configured to absorb light of a different wavelength band from the first and second quantum dot layers without the use of a color filter corresponding thereto.

The first photoelectric conversion element may be configured to detect light corresponding to any one of red (R), green (G), blue (B), and infrared (IR) light, the second photoelectric conversion element may be configured to detect light corresponding to another one of the R, G, B, and IR light, and the third photoelectric conversion element may be configured to detect light corresponding to another one of the R, G, B, and IR light.

The photoelectric conversion elements may be spaced apart from each other in a horizontal direction.

The photoelectric conversion elements may be stacked in a vertical direction.

At least one of the first and second semiconductor layers may include an oxide semiconductor.

The oxide semiconductor may include at least one of a zinc oxide (ZnO)-based oxide, an indium oxide (InO)-based oxide, and a tin oxide (SnO)-based oxide.

The oxide semiconductor may include, for example, at least one of a silicon indium zinc oxide (SIZO), a silicon zinc tin oxide (SZTO), a zinc oxide (ZnO), an indium zinc oxide (IZO), a zinc tin oxide (ZTO), a gallium indium zinc oxide (GIZO), a hafnium indium zinc oxide (HIZO), an indium zinc tin oxide (IZTO), a tin oxide (SnO), an indium tin oxide (ITO), an indium gallium oxide (IGO), an indium oxide (InO), and an aluminum indium oxide (AIO).

At least one of the first and second semiconductor layers may have an energy band gap of about 3.0 eV to about 5.0 eV.

At least one of the first and second quantum dot layers may be embedded in the semiconductor layer corresponding thereto.

One or more quantum dots included in at least one of the first and second quantum dot layers may include at least one of a II-VI group-based semiconductor, a III-V group-based semiconductor, a IV-VI group-based semiconductor, a IV group-based semiconductor, and a graphene quantum dot.

The photoelectric device may further include at least one gate electrode configured to apply an electric field to the photoelectric conversion elements.

The photoelectric device may be a photodetector or a photovoltaic device.

According to an aspect of another exemplary embodiment, an electronic apparatus includes one or more photoelectric devices described above.

According to an aspect of another exemplary embodiment, a photoelectric device includes: a plurality of photoelectric conversion elements configured to convert optical energy into electrical energy, wherein the photoelectric conversion elements include first to third photoelectric conversion elements, the first photoelectric conversion element includes a first photoactive layer between first and second electrodes and the first photoactive layer includes a first quantum dot layer configured to generate a charge in response to light and a first semiconductor layer configured to provide a channel for conducting the charge generated by the first quantum dot layer, the second photoelectric conversion element includes a second photoactive layer between third and fourth electrodes and the second photoactive layer includes a second quantum dot layer configured to generate a charge in response to light and a second semiconductor layer configured to provide a channel for conducting the charge generated by the second quantum dot layer, the third photoelectric conversion element includes a third photoactive layer between fifth and sixth electrodes and the third photoactive layer includes a third quantum dot layer configured to generate a charge in response to light and a third semiconductor layer configured to provide a channel for conducting the charge generated by the third quantum dot layer, and the first to third quantum dot layers are configured to absorb lights of different wavelength bands without the use of color filters corresponding thereto.

The first to third photoelectric conversion elements may be stacked sequentially on a substrate.

The photoelectric device may further include at least one of: a first gate electrode provided below the first photoelectric conversion element; a second gate electrode provided between the first and second photoelectric conversion elements; and a third gate electrode provided between the second and third photoelectric conversion elements.

The first photoelectric conversion element may be configured to detect light corresponding to any one of red (R), green (G), and blue (B) light, the second photoelectric conversion element may be configured to detect light corresponding to another one of the R, G, and B light, and the third photoelectric conversion element may be configured to detect light corresponding to another one of the R, G, and B light.

The first photoelectric conversion element may be configured to detect red (R) light, the second photoelectric conversion element may be configured to detect green (G) light, and the third photoelectric conversion element may be configured to detect blue (B) light.

The first photoelectric conversion element may be configured to detect blue (B) light, the second photoelectric conversion element may be configured to detect red (R) light, and the third photoelectric conversion element may be configured to detect green (G) light.

The first photoelectric conversion element may have a first width, the second photoelectric conversion element may have a second width less than or equal to the first width, and the third photoelectric conversion element may have a third width less than or equal to the second width.

The second and third photoelectric conversion elements may be provided on different regions of the first photoelectric conversion element, and the first photoelectric conversion element may have a width greater than those of the second and third photoelectric conversion elements. In this case, the first photoelectric conversion element may be configured to detect blue (B) light, the second photoelectric conversion element may be configured to detect red (R)

light, and the third photoelectric conversion element may be configured to detect green (G) light.

The first to third photoelectric conversion elements may form a stacked structure, and the stacked structure may have a hexagonal structure when viewed from above.

The first to sixth electrodes may be provided at six sides of the hexagonal structure, and the first, third, and fifth electrodes may be provided to face the second, fourth, and sixth electrodes respectively.

The first to third photoelectric conversion elements may form a stacked structure, and the stacked structure may have an octagonal structure when viewed from above.

The photoelectric device may further include a gate electrode provided at least one of between the first and second photoelectric conversion elements and between the second and third photoelectric conversion elements.

The first to sixth electrodes may be provided at six sides among eight sides of the octagonal structure, and at least one gate contact portion for connection to the gate electrode may be provided at other sides among the eight sides.

At least one of the first to third semiconductor layers may include an oxide semiconductor.

The oxide semiconductor may include at least one of a zinc oxide (ZnO)-based oxide, an indium oxide (InO)-based oxide, and a tin oxide (SnO)-based oxide.

The oxide semiconductor may include, for example, at least one of a silicon indium zinc oxide (SIZO), a silicon zinc tin oxide (SZTO), a zinc oxide (ZnO), an indium zinc oxide (IZO), a zinc tin oxide (ZTO), a gallium indium zinc oxide (GIZO), a hafnium indium zinc oxide (HIZO), an indium zinc tin oxide (IZTO), a tin oxide (SnO), an indium tin oxide (ITO), an indium gallium oxide (IGO), an indium oxide (InO), and an aluminum indium oxide (AIO).

At least one of the first to third semiconductor layers may have an energy band gap of about 3.0 eV to about 5.0 eV.

At least one of the first to third quantum dot layers may be embedded in the semiconductor layer corresponding thereto.

One or more quantum dots included in at least one of the first to third quantum dot layers may include at least one of a II-VI group-based semiconductor, a III-V group-based semiconductor, a IV-VI group-based semiconductor, a IV group-based semiconductor, and a graphene quantum dot.

According to an aspect of another exemplary embodiment, an electronic apparatus includes one or more photoelectric devices described above.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

Figure 1:
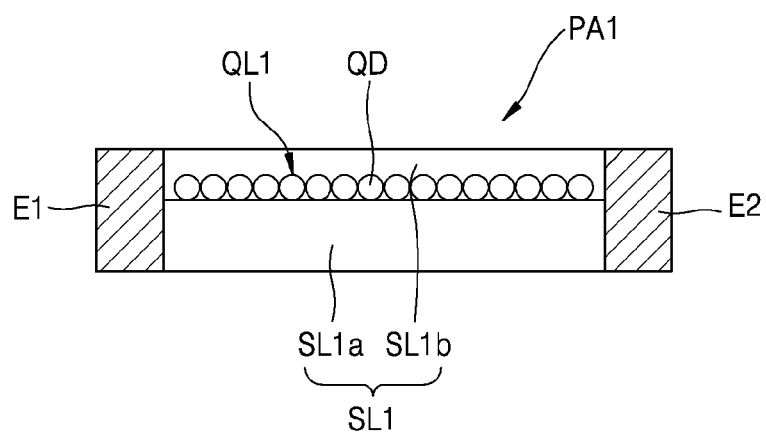
FIG. 1 is a cross-sectional view illustrating a photoelectric device according to an exemplary embodiment.

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain certain aspects of the embodiments. As used herein, the term "and/or" includes any and all combinations of one or more of the associated listed items. Expressions such as "at least one of," when preceding a list of elements, modify the entire list of elements and do not modify the individual elements of the list.

Various exemplary embodiments will now be described more fully with reference to the accompanying drawings.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of exemplary embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a", "an", and "the" are intended to include the plural forms as well, unless the context clearly indicates otherwise. It will be further understood that the terms "comprise", "include", and/or "have", when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, photoelectric devices and electronic apparatuses including the same according to exemplary embodiments will be described in detail with reference to the accompanying drawings. The widths and thicknesses of layers or regions illustrated in the accompanying drawings may be exaggerated for clarity and convenience of description. Like reference numerals may denote like elements throughout the specification.

FIG. 1 is a cross-sectional view illustrating a photoelectric device according to an exemplary embodiment.

Referring to FIG. 1, the photoelectric device may include a photoactive layer PAL The photoactive layer PA1 may include a quantum dot layer QL1 and a semiconductor layer SL1 contacting the quantum dot layer QL1. The quantum dot layer QL1 may absorb light and generate a charge (also referred to as a carrier) in response to the absorbed light. In other words, the charge may be excited by the light incident on the quantum dot layer QL1. The semiconductor layer SL1 may provide a channel for transferring the charge generated by the quantum dot layer QL1. In other words, the charge generated by the quantum dot layer QL1 may be transferred through the semiconductor layer SL1. The photoelectric device of the present exemplary embodiment may further include a first electrode E1 and a second electrode E2 that respectively contact a first end and a second end of the channel of the photoactive layer PAL The first electrode E1 may contact a first region (e.g., the first end) of the photoactive layer PA1, and the second electrode E2 may contact a second region (e.g., the second end) of the photoactive layer PA1. The semiconductor layer SL1 may provide a path (i.e., a channel) for transferring the charge between the first electrode E1 and the second electrode E2. The charge generation characteristics based on the light absorption may be improved by the presence of the quantum dot layer QL1, and the charge transfer characteristics may be improved by the presence of the semiconductor layer SL1.

The quantum dot layer QL1 may include a plurality of quantum dots QD. The quantum dots QD may form a single-layer structure or a multilayer structure. Alternatively, the quantum dots QD may form a structure of less than one layer. This will be described in more detail with reference to FIG. 35. Each of the quantum dots QD may have a core-shell structure including a core and a shell or may have a shell-less particle structure. The core-shell structure may be a single-shell structure or a multi-shell structure. The multi-shell structure may be, for example, a double-shell structure. Each of the quantum dots QD may have a diameter of about tens of nm or less, for example, a diameter of about 10 nm or less. Although not illustrated, an organic ligand or an inorganic ligand may be present on the surface of the quantum dot QD. The quantum dot QD may be a colloidal quantum dot.

The quantum dots QD constituting the quantum dot layer QL1 may include, for example, at least one of a II-VI group-based semiconductor, a III-V group-based semiconductor, a IV-VI group-based semiconductor, a IV group-based semiconductor, and a graphene quantum dot. The II-VI group-based semiconductor may include, for example, at least one of a binary compound such as CdS, CdSe, CdTe, ZnS, ZnSe, ZnTe, ZnO, HgS, HgSe, or HgTe; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, or HgZnSe; and a quaternary compound such as CdHgZnTe, CdZnSeS, CdZnSeTe, CdZnSTe, CdHgSeS, CdHgSeTe, CdHgSTe, HgZnSeS, HgZnSeTe, or HgZnSTe; or any combination thereof. The III-V group-based semiconductor may include, for example, at least one of a binary compound such as GaN, GaP, GaAs, GaSb, AN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InNP, InNAs, InNSb, InPAs, or InPSb; and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The IV-VI group-based semiconductor may include, for example, a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof. The IV group-based semiconductor may include, for example, Si, Ge, SiGe, SiC, or any combination thereof. The graphene quantum dot may be a quantum dot including a graphene.

As an example, when the quantum dot QD has a shell-less particle structure, it may include CdSe and/or InP. When the quantum dot QD has a core-shell structure having a single-shell structure, it may include, for example, a CdSe/CdS (core/shell) structure or an InP/ZnS (core/shell) structure. When the quantum dot QD has a core-shell-shell structure having a double-shell structure, it may include, for example, a CdSe/CdS/ZnS (core/shell/shell) structure. However, the above-described materials and combinations are merely exemplary, and various other material combinations may be used. The diameter of the quantum dot QD may be about 1 nm to about tens of nm.

The quantum dot layer QL1 may absorb a light of a certain wavelength band and thereby generate a charge (electron-hole pair) (also referred to as a carrier). The wavelength band of the light absorbed by the quantum dot layer QL1 may vary according to the materials, configurations, and/or sizes of the quantum dots QD constituting the quantum dot layer QL1. Thus, the wavelength band of the light absorbed by the quantum dot layer QL1 may be easily changed by changing the materials, configurations, and/or sizes of the quantum dots QD. For example, a material such as CdSe, CdS, CdTe, InP, GaAs, AlSb, GaSb, InAs, InN, ZnSb, MoS, CuO, or Si may be a quantum dot (QD) material suitable for absorbing a red (R) light, a material such as CdSe, CdS, CdTe, InP, GaAs, AlSb, GaSb, InAs, InN, ZnSb, MoS, CuO, or Si may be a quantum dot (QD) material suitable for absorbing a green (G) light, a material such as CdSe, CdS, InP, ZnSe, MnSe, GaP, AlAs, ZnTe, MnTe, FeO, or AlP may be a quantum dot (QD) material suitable for absorbing a blue (B) light, and a material such as PbSe, PbS, Ge, HgSe, HgS, HgTe, InSb, SbSe, or SbTe may be a quantum dot (QD) material suitable for absorbing an infrared (IR) light. Even the same material (e.g., CdSe) may absorb light of different wavelengths depending on the sizes of the quantum dots.

The semiconductor layer SL1 may include an oxide semiconductor. The oxide semiconductor may be a non-silicon-based inorganic semiconductor. The oxide semiconductor may include, for example, at least one of a zinc oxide (ZnO)-based oxide, an indium oxide (InO)-based oxide, and a tin oxide (SnO)-based oxide. As an example, the oxide semiconductor may include at least one of a silicon indium zinc oxide (SIZO), a silicon zinc tin oxide (SZTO), a zinc oxide (ZnO), an indium zinc oxide (IZO), a zinc tin oxide (ZTO), a gallium indium zinc oxide (GIZO), a hafnium indium zinc oxide (HIZO), an indium zinc tin oxide (IZTO), a tin oxide (SnO), an indium tin oxide (ITO), an indium gallium oxide (IGO), an indium oxide (InO), and an aluminum indium oxide (AIO). Herein, the SIZO may be an IZO doped with silicon (Si) and similarly, the SZTO may be a ZTO doped with Si. By Si doping, the carrier concentration of the IZO and the ZTO may be adjusted and the stability and reliability thereof may be improved. The ITO or the like may have semiconductor characteristics or conductor characteristics according to the composition ratio of component materials (elements) thereof, and the ITO having semiconductor characteristics may be used herein. Also, the above use of terms such as SIZO, SZTO, ZnO, IZO, ZTO, GIZO, HIZO, IZTO, SnO, ITO, IGO, InO, and AIO does not define the composition ratio of component materials, and the composition ratio thereof may be properly determined. The semiconductor layer SL1 including the above materials may efficiently transport the charge generated by the quantum dot layer QL1, while absorbing little or no visible light. Thus, the semiconductor layer SL1 may have a relatively large energy band gap. The energy band gap of the semiconductor layer SL1 may be about 3.0 eV or more, for example, about 3.0 eV to about 5.0 eV. Also, the semiconductor layer SL1 may have a relatively high Hall mobility. The semiconductor layer SL1 may have a Hall mobility of about 1 cm$^2$/Vs or more. The Hall mobility of the semiconductor layer SL1 may be about 1 cm$^2$/Vs to about several hundreds of cm$^2$/Vs. For example, the Hall mobility of the semiconductor layer SL1 may be about 10 cm$^2$/Vs or more, or about 20 cm$^2$/Vs or more. As an example, the Hall mobility of the SIZO may be about 30 cm$^2$/Vs. Thus, the semiconductor layer SL1 may have excellent charge (carrier) transfer characteristics. The semiconductor layer SL1 may include an amorphous phase. Alternatively, the semiconductor layer SL1 may include both an amorphous phase and a crystalline phase.

The photoactive layer PA1 may have a structure in which the quantum dot layer QL1 is embedded in the semiconductor layer SL1, as shown in FIG. 1. In other words, the semiconductor layer SL1 may include a lower semiconductor layer SL1a and an upper semiconductor layer SL1b, and the quantum dot layer QL1 may be provided between the lower semiconductor layer SL1a and the upper semiconductor layer SL1b. The lower semiconductor layer SL1a and the upper semiconductor layer SL1b may include the same materials, or may include different materials. In the former case, for example, both the lower semiconductor layer SL1a and the upper semiconductor layer SL1b may include the SIZO or may include another of the above-described exemplary materials. The lower semiconductor layer SL1a may be formed first, the quantum dot layer QL1 may be formed on the lower semiconductor layer SL1a, and the upper semiconductor layer SL1b may be formed on the lower semiconductor layer SL1a, covering cover the quantum dot layer QL1. In this case, the material of the upper semiconductor layer SL1b may contact the quantum dots QD of the quantum dot layer QL1 and may fill the spaces between and among the quantum dots QD of the quantum dot layer QL1. Thus, the charge separation efficiency in the quantum dot layer QL1 may increase, and the generated charge may be more easily transferred to the semiconductor layer SL1 to contribute to the photoconduction thereof.

The lower semiconductor layer SL1a and the upper semiconductor layer SL1b may have different thicknesses. As an example, the lower semiconductor layer SL1a may have a larger thickness than the upper semiconductor layer SL1b. In this case, the lower semiconductor layer SL1a may function as a main channel, and the upper semiconductor layer SL1b may function as an auxiliary channel while protecting the quantum dot layer QL1. As another example, the upper semiconductor layer SL1b may have a larger thickness than the lower semiconductor layer SL1a. In this case, the upper semiconductor layer SL1b having the relatively large thickness may function as the main channel, and the lower semiconductor layer SL1a having the relatively small thickness may function as the auxiliary (sub) channel. Alternatively, the lower semiconductor layer SL1a and the upper semiconductor layer SL1b may have the same thicknesses. Each of the lower semiconductor layer SL1a and the upper semiconductor layer SL1b may have a thickness of about several nm to about hundreds of nm. For example, each of the lower semiconductor layer SL1a and the upper semiconductor layer SL1b may have a thickness of about 3 nm to about 100 nm.

The first electrode E1 and the second electrode E2 may include, for example, a metal and/or a metal compound. The material of the first electrode E1 and the second electrode E2 is not particularly limited, and the first electrode E1 and the second electrode E2 may include any conductive material (e.g., a metal and/or a metal compound) that may be used as an electrode in a typical semiconductor device (or electronic device). The first electrode E1 and the second electrode E2 may be spaced apart from each other in a direction parallel to largest surface of the photoactive layer PAL The first electrode E1 may contact the semiconductor layer SL1 at the first end of the photoactive layer PA1, and in this case, the first electrode E1 may contact both the lower semiconductor layer SL1a and the upper semiconductor layer SL1b or any one of the lower semiconductor layer SL1a and the upper semiconductor layer SL1b, for example, only the lower semiconductor layer SL1a. Also, the first electrode E1 may or may not contact the quantum dot layer QL1 at the first end of the photoactive layer PAL The second electrode E2 may contact the semiconductor layer SL1 at the second end of the photoactive layer PA1, and in this case, the second electrode E2 may contact both the lower semiconductor layer SL1a and the upper semiconductor layer SL1b or any one of the lower semiconductor layer SL1a and the upper semiconductor layer SL1b, for example, only the lower semiconductor layer SL1a. Also, the second electrode E2 may or may not contact the quantum dot layer QL1 at the second end of the photoactive layer PAL The photoelectric device of FIG. 1 may be a two-terminal device having two electrodes (E1 and E2). The photoelectric device may sense a current, which is generated by light in the photoactive layer PA1, between the first and second electrodes E1 and E2, or may generate electrical energy by using the photovoltaic characteristics of the photoactive layer PAL Thus, the photoelectric device of FIG. 1 may be used, for example, as a photodetector or a photovoltaic device.

According to another exemplary embodiment, a transistor structure, that is, a phototransistor may be implemented by adding a gate electrode to the photoelectric device of FIG. 1. An example thereof is illustrated in FIG. 2.

Figure 2:
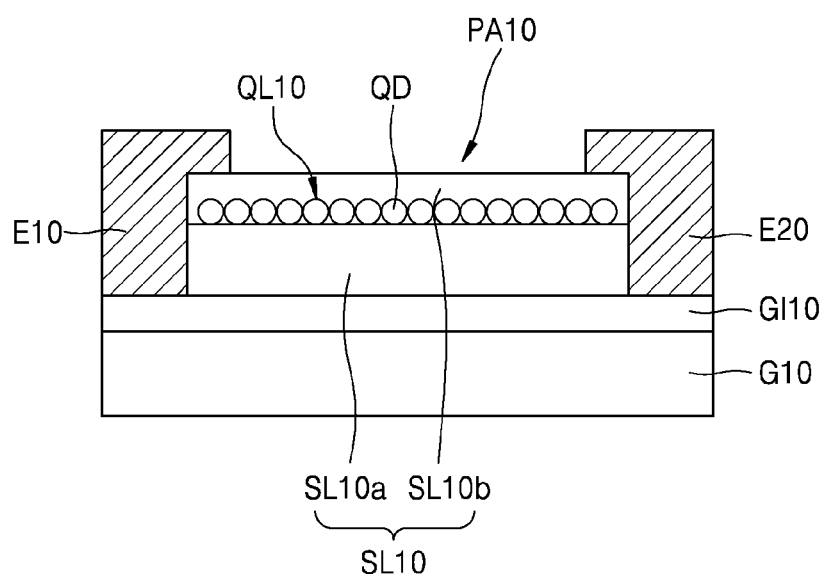
FIG. 2 is a cross-sectional view illustrating a photoelectric device according to another exemplary embodiment.

Referring to FIG. 2, a photoactive layer PA10 having an identical or similar structure to the photoactive layer PA1 illustrated in FIG. 1 may be provided. The photoactive layer PA10 may include a quantum dot layer QL10 and a semiconductor layer SL10, and the semiconductor layer SL10 may include a lower semiconductor layer SL10a and an upper semiconductor layer SL10b. Also, first and second electrodes E10 and E20 may be provided in different regions of the photoactive layer PA10. One of the first and second electrodes E10 and E20 may be a source electrode, and the other one may be a drain electrode. In addition, the photoelectric device of the present exemplary embodiment may further include a gate electrode G10 for applying an electric field to the photoactive layer PA10. The gate electrode G10 may be provided below or above the photoactive layer PA10. In the present exemplary embodiment, as an exemplary case, the gate electrode G10 is provided below the photoactive layer PA10. A gate insulating layer GI10 may be provided between the gate electrode G10 and the photoactive layer PA10.

The gate electrode G10 may be a kind of conductive substrate or may be formed of a conductive material in a substrate. The gate electrode G10 may include a flexible material such as a conductive polymer, or may include a rigid material such as a doped semiconductor (e.g., doped silicon). Alternatively, the gate electrode G10 may include, for example, a metal, a metal compound, a graphene, and/or a carbon nanotube (CNT). The gate insulating layer GI10 may include a silicon oxide, a silicon nitride, or a silicon oxynitride, or may include any other material layer, for example, a high dielectric material having a dielectric constant higher than that of a silicon nitride. Also, the gate insulating layer GI10 may include an organic insulating material such as an insulating polymer. The gate insulating layer GI10 may have a single-layer structure or a multilayer structure.

By applying an electric field to the photoactive layer PA10 using the gate electrode G10, the photoelectric conversion characteristics of the photoactive layer PA10 may be improved and controlled. Also, since the photoelectric device of FIG. 2 has a transistor function as well as a photoelectric conversion function, it may be advantageously used as a multifunctional device in various electronic apparatuses.

Figure 3:
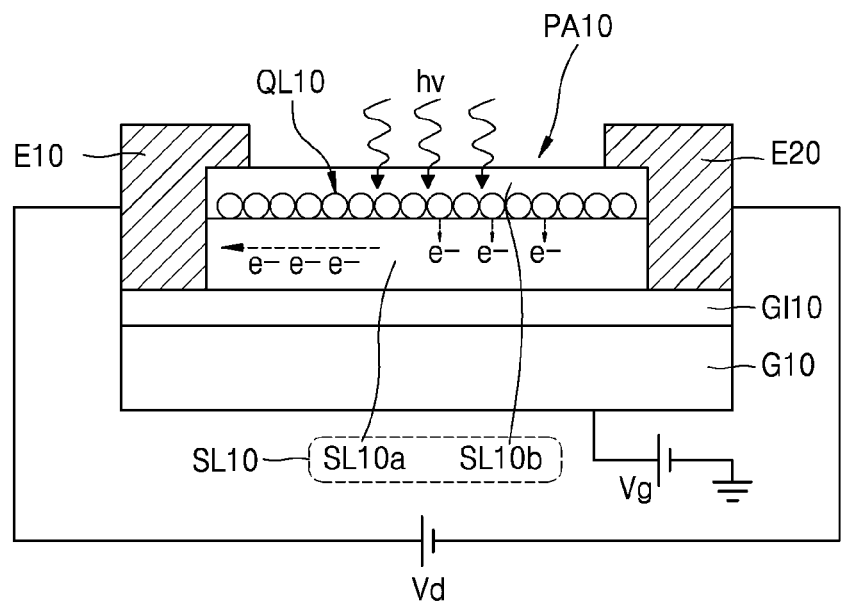
FIG. 3 is a conceptual diagram illustrating principle of operation of the photoelectric device of FIG. 2.

FIG. 3 is a conceptual diagram illustrating a principle of operation of the photoelectric device of FIG. 2.

Referring to FIG. 3, when light energy (hv) (h=Planck's constant, v=Frequency of light) is irradiated onto the photoactive layer PA10, a charge (e−) may be generated by the quantum dot layer QL10 and the generated charge (e−) may be transferred between the first and second electrodes E10 and E20 through the semiconductor layer SL10. By applying a gate voltage Vg to the gate electrode G10, an electric field may be applied to the photoactive layer PA10. Since the energy band structure of the photoactive layer PA10 is altered by the electric field, the charge (e−) generated by the quantum dot layer QL10 may be more easily transferred to the semiconductor layer SL10 to contribute the photoconduction thereof. The semiconductor layer SL10 may have an increased Fermi level due to a photodoping effect caused by the charges (e−) received from the quantum dot layer QL10, and thus may efficiently transport the received charges (e−) even at a low or negative gate voltage Vg. Also, a drain voltage Vd may be applied between the first electrode E10 and the second electrode E20. By means of the drain voltage Vd, the charge (e−) may easily flow through the semiconductor layer SL10 from the second electrode E20 to the first electrode E10 or in the reverse direction, from the first electrode E10 to the second electrode E20. In other words, a photocurrent may easily flow through the semiconductor layer SL10 between the first and second electrodes E10 and E20.

The lower semiconductor layer SL10a and the upper semiconductor layer SL10b may be disposed such that the lower semiconductor layer SL10a is closer than the upper semiconductor layer SL10b to the gate electrode G10. The lower semiconductor layer SL10a may function as a main channel for transferring the charge (e−), and the upper semiconductor layer SL10b may function as an auxiliary channel for transferring the charge (e−) while protecting the quantum dot layer QL10. The lower semiconductor layer SL10a adjacent to the gate electrode G10, that is, the lower semiconductor layer SL10a functioning as the main channel, may have a larger thickness than the upper semiconductor layer SL10b. However, in some cases, the lower semiconductor layer SL10a and the upper semiconductor layer SL10b may have the same thickness or similar thicknesses.

Figure 4A:
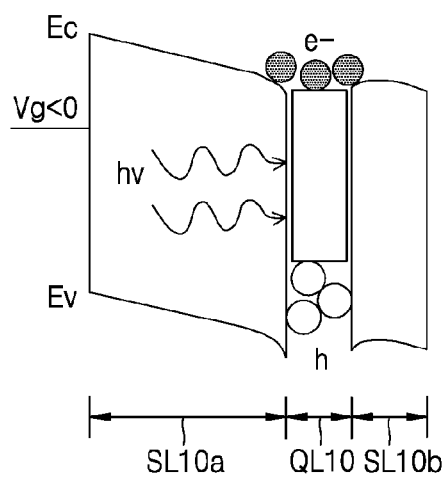
FIGS. 4A and 4B are energy band diagrams illustrating how an energy band structure of a photoactive layer changes with a gate voltage Vg when a photoelectric device operates as illustrated in FIG. 3.
Figure 4B:
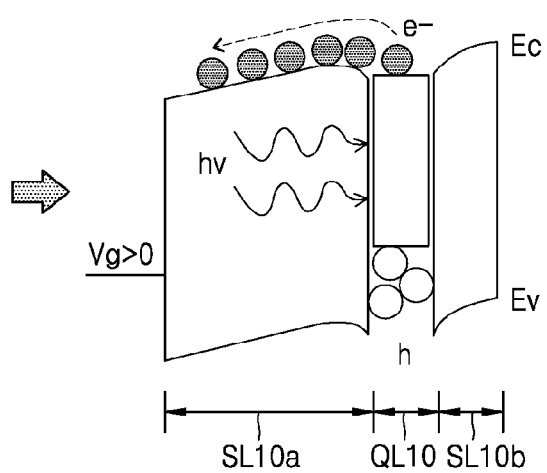

FIGS. 4A and 4B are energy band diagrams illustrating how the energy band structure of the photoactive layer PA10 changes according to the gate voltage Vg when the photoelectric device operates as illustrated in FIG. 3. FIG. 4A illustrates a case in which the gate voltage Vg is lower than 0 V, and FIG. 4B illustrates a case in which the gate voltage Vg is higher than 0 V. In FIGS. 4A and 4B, Ev and Ec denote a valence band maximum energy level and a conduction band minimum energy level respectively.

As illustrated in FIG. 4A, when light energy (hv) is irradiated to the photoactive layer QL10, electrons (e−) and holes (h) may be separated in the quantum dot layer QL10. That is, a plurality of electrons (e−) and holes (h) may be generated. In this case, when the gate voltage Vg is lower than 0 V, that is, when a negative (−) voltage is applied to the gate electrode G10 (see FIG. 3), the discharge efficiency of the electrons (e−) generated by the quantum dot layer QL10 into the semiconductor layers SL10a and SL10b may be degraded.

As illustrated in FIG. 4B, when the gate voltage Vg is higher than 0 V, that is, when a positive (+) voltage is applied to the gate electrode G10 (see FIG. 3), the discharge efficiency of the electrons (e−) generated by the quantum dot layer QL10 into the semiconductor layers SL10a and SL10b may be considerably improved with the change of the energy band structure. Herein, although it is illustrated that the electrons (e−) are transferred mainly to the lower semiconductor layer SL10a, some of the electrons (e−) may be transferred to the upper semiconductor layer SL10b. In this manner, the photoelectric conversion characteristics may be improved and controlled by using the gate voltage Vg.

Figure 5:
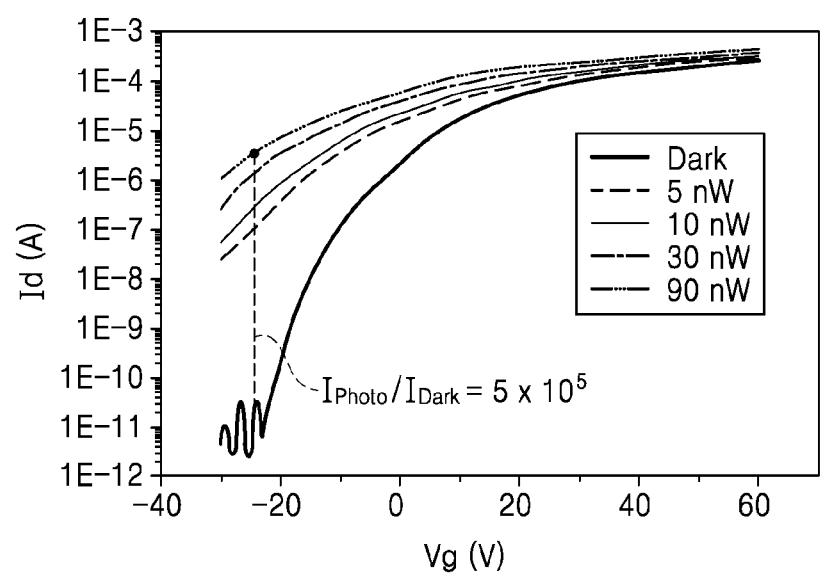
FIG. 5 is a graph illustrating how the relationship between the gate voltage Vg and drain current Id characteristics of a photoelectric device change with the intensity of light incident on a photoelectric device described with reference to FIG. 3.

FIG. 5 is a graph illustrating how the relationship between the gate voltage Vg and drain current Id characteristics of a photoelectric device change according to the intensity of light incident on the photoelectric device described with reference to FIG. 3. The Vg and Id characteristics are evaluated while irradiating the photoelectric device with light of power levels of about 5 nW, about 10 nW, about 30 nW, and about 90 nW. Also, the Vg-Id characteristics are evaluated with no light incident on the photoelectric device, that is, in a "Dark" state.

Referring to FIG. 5, it may be seen that the Vg-Id curve shifts upward as the power of the irradiated light increases. This means that the photocurrent generated by the photoactive layer PA10 (see FIG. 3) increases as the power of the irradiated light increases. Also, it may be seen that the ratio between a current ($I_{Photo}$) generated when irradiating the light at a gate voltage Vg and a current ($b_{Dark}$) generated when no light is irradiated, that is, an $I_{Photo}/I_{Dark}$ has a very high value of about $5 \times 10^5$. This means that the on and off characteristics of the photoelectric device (phototransistor), according to the light irradiation, are excellent.

Figure 6:
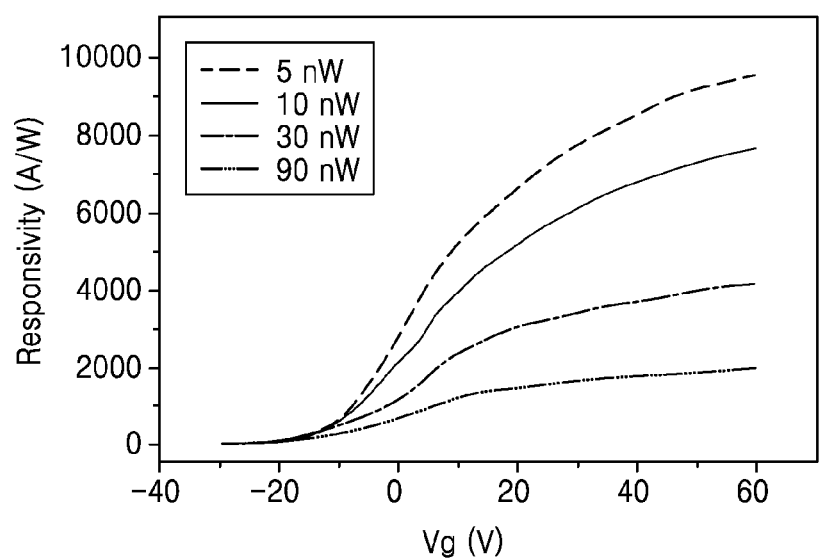
FIG. 6 is a graph illustrating how the responsivity of a photoelectric device changes with the intensity of light incident on a photoelectric device described with reference to FIG. 3.

FIG. 6 is a graph illustrating how the responsivity of the photoelectric device changes according to the intensity of light incident on the photoelectric device described with reference to FIG. 3. The change in the responsivity according to the gate voltage Vg is measured while irradiating light with power levels of about 5 nW, about 10 nW, about 30 nW, and about 90 nW.

Referring to FIG. 6, it may be seen that the light responsivity of the photoelectric device increases relatively greatly as the gate voltage Vg increases. The responsivity increase according to the gate voltage (Vg) increase may increase as the power of the irradiated light decreases. Herein, it may be seen that the measured responsivity has a value of about 1000 A/W to about 10000 A/W in a certain gate voltage (Vg) range.

Figure 7:
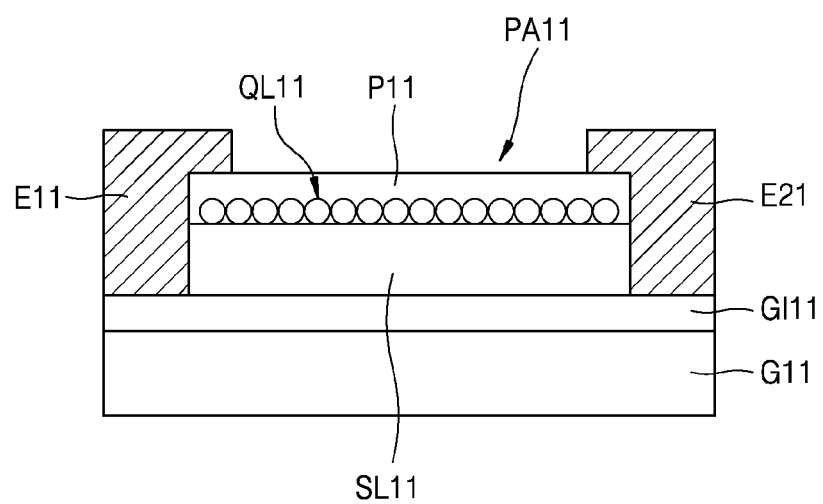
FIG. 7 is a cross-sectional view illustrating a photoelectric device according to another exemplary embodiment.

The photoelectric device (phototransistor) of FIG. 2 may be modified in various ways. An example thereof is illustrated in FIG. 7. That is, FIG. 7 illustrates a photoelectric device according to another exemplary embodiment. In the exemplary embodiment of FIG. 7, a protection layer P11 is used instead of the upper semiconductor layer SL10b of FIG. 2.

Referring to FIG. 7, a photoactive layer PA11 may include a semiconductor layer SL11 and a quantum dot layer QL11 provided on the semiconductor layer SL11. The semiconductor layer SL11 and the quantum dot layer QL11 may correspond respectively to the lower semiconductor layer SL10a and the quantum dot layer QL10 of FIG. 2. Thus, the semiconductor layer SL11 may include an oxide semiconductor, and the oxide semiconductor may include at least one of a ZnO-based oxide, an InO-based oxide, and a SnO-based oxide. As an example, the semiconductor layer SL11 may include at least one of SIZO, SZTO, ZnO, IZO, ZTO, GIZO, HIZO, IZTO, SnO, ITO, IGO, InO, and AIO.

The protection layer P11 may be provided on the quantum dot layer QL11. The protection layer P11 may include an insulating material. For example, the protection layer P11 may include a silicon oxide, a silicon oxynitride, or a silicon nitride, or may include a high dielectric material having a high dielectric constant than a silicon nitride. Alternatively, the protection layer P11 may include an organic insulating material such as an insulating polymer. In some cases, the protection layer P11 may include a non-oxide semiconductor. In this case, the protection layer P11 may also function as an upper channel (auxiliary channel), and may be considered as a portion of the photoactive layer PA11. A gate electrode G11, a gate insulating layer GI11, a first electrode E11, and a second electrode E21 of FIG. 7 may be identical or similar respectively to the gate electrode G10, the gate insulating layer GI10, the first electrode E10, and the second electrode E20 described with reference to FIG. 2.

Figure 8:
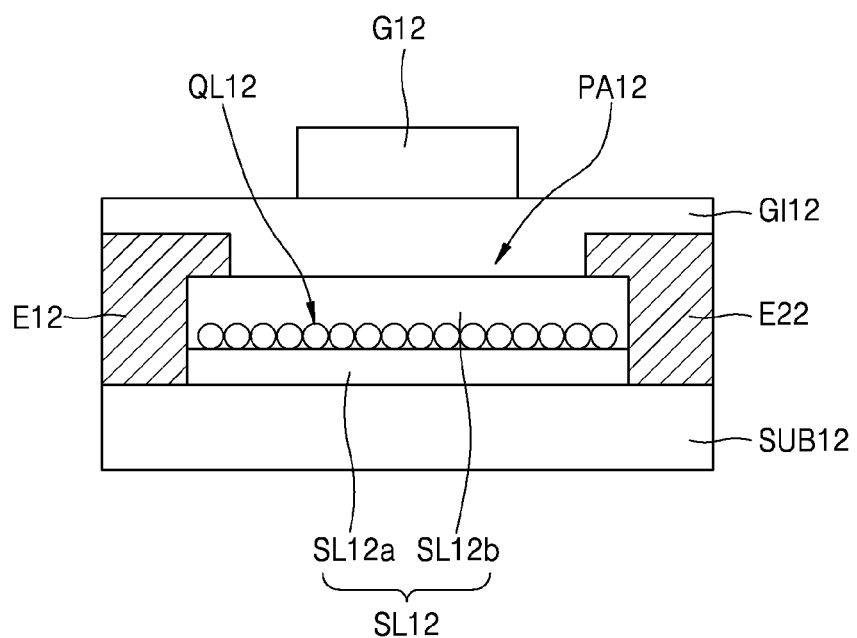
FIG. 8 is a cross-sectional view illustrating a photoelectric device according to another exemplary embodiment.

FIG. 8 is a cross-sectional view illustrating a photoelectric device according to another exemplary embodiment. The present exemplary embodiment illustrates a photoelectric device (here, a phototransistor) having a top-gate structure.

Referring to FIG. 8, a photoactive layer PA12 may be provided on a substrate SUB12. The photoactive layer PA12 may include a quantum dot layer QL12 and a semiconductor layer SL12 contacting the quantum dot layer QL12. The semiconductor layer SL12 may include a lower semiconductor layer SL12a and an upper semiconductor layer SL12b, and the quantum dot layer QL12 may be provided between the lower semiconductor layer SL12a and the upper semiconductor layer SL12b. Thus, the quantum dot layer QL12 may be referred to as being embedded in the semiconductor layer SL12. The materials and characteristics of the lower semiconductor layer SL12a and the upper semiconductor layer SL12b may be similar to those of the lower semiconductor layer SL10a and the upper semiconductor layer SL10b described with reference to FIG. 2. However, in the present exemplary embodiment, the thickness of the upper semiconductor layer SL12b may be larger than the thickness of the lower semiconductor layer SL12a.

First and second electrodes E12 and E22 contacting first and second regions of the photoactive layer PA12 may be provided on the substrate SUB12. A gate insulating layer GI12, covering the photoactive layer PA12 between the first and second electrodes E12 and E22, may be provided. The gate insulating layer GI12 may be extended to cover the first and second electrodes E12 and E22, as shown in FIG. 8. A gate electrode G12 may be provided on the gate insulating layer GI12. The gate electrode G12 may be disposed above the photoactive layer PA12. The gate electrode G12 may be referred to as a top gate.

In the present exemplary embodiment, the upper semiconductor layer SL12b is closer to the gate electrode G12 than is the lower semiconductor layer SL12a. In this case, the thickness of the upper semiconductor layer SL12b may be larger than the thickness of the lower semiconductor layer SL12a. The upper semiconductor layer SL12b may be used as a main channel, and the lower semiconductor layer SL12a may be used as an auxiliary (sub) channel. However, in some cases, the lower semiconductor layer SL12a and the upper semiconductor layer SL12b may have the same thickness or similar thicknesses.

The lower semiconductor layer SL12a may be omitted from the structure of FIG. 8. An example thereof is illustrated in FIG. 9.

Figure 9:
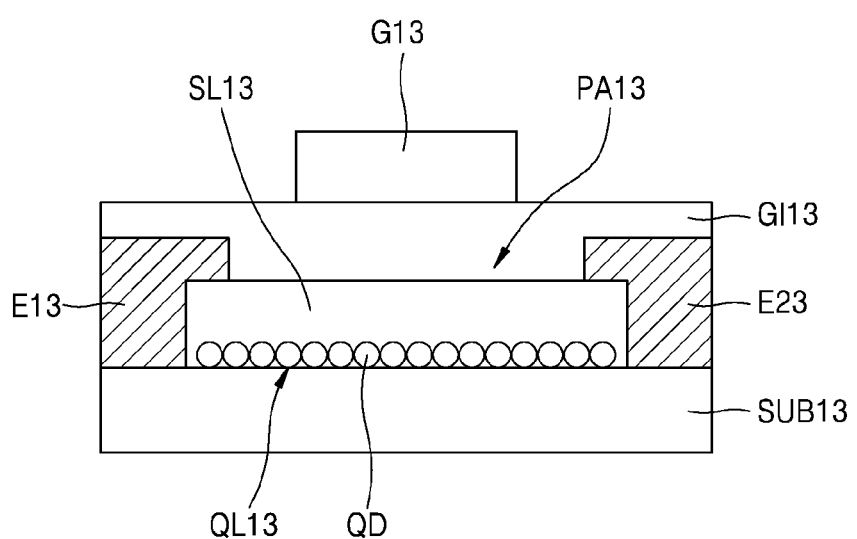
FIG. 9 is a cross-sectional view illustrating a photoelectric device according to another exemplary embodiment.

Referring to FIG. 9, a quantum dot layer QL13 may be provided on a substrate SUB13, and a semiconductor layer SL13 covering the quantum dot layer QL13 may be provided. The quantum dot layer QL13 and the semiconductor layer SL13 may constitute a photoactive layer PA13. The material of the semiconductor layer SL13 may fill the spaces between and among the plurality of quantum dots QD of the quantum dot layer QL13. Thus, the photoactive layer PA13 may be referred to as having an embedded structure in which the quantum dot layer QL13 is embedded in the semiconductor layer SL13. The material of the semiconductor layer SL13 may be identical or similar to the material of the semiconductor layer SL1 described with reference to FIG. 1.

First and second electrodes E13 and E23 may be provided on the substrate SUB13 and may contact different regions of the photoactive layer PA13. A gate insulating layer GI13 may be provided on the photoactive layer PA13, and a gate electrode G13 may be provided on the gate insulating layer GI13.

Figure 10:
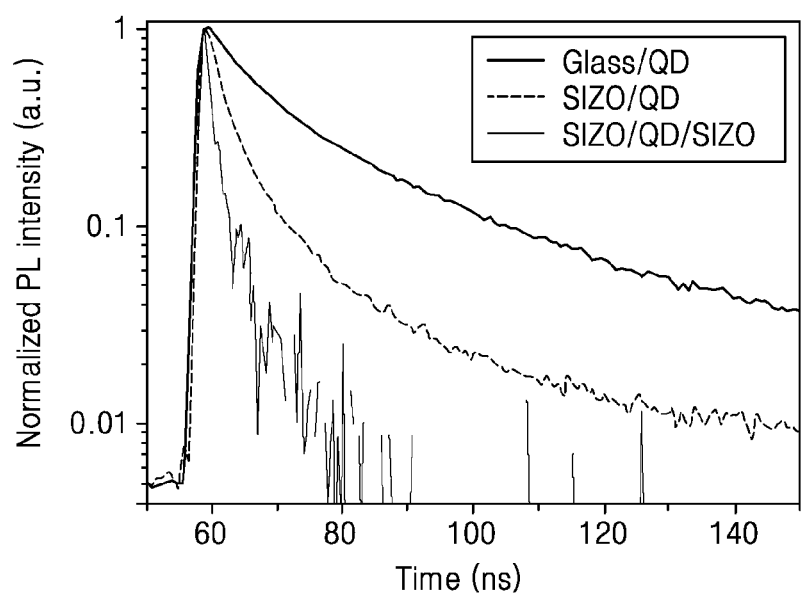
FIG. 10 is a graph illustrating a time-dependent photoluminescence (PL) intensity change in photoactive layer structures that may be utilized in photoelectric devices according to exemplary embodiments.

FIG. 10 is a graph illustrating a time-dependent photoluminescence (PL) intensity change in photoactive layer structures that may be utilized in photoelectric devices according to exemplary embodiments. For comparison, a structure in which a quantum dot layer is formed on a glass substrate, that is, a glass/QD structure is used. A structure in which a quantum dot layer is formed on a SIZO substrate, that is, a SIZO/QD structure is used as a photoactive layer structure according to an exemplary embodiment. A structure in which a quantum dot layer is formed on a SIZO substrate and a SIZO layer is formed on the quantum dot layer, that is, a SIZO/QD/SIZO structure is used as a photoactive layer structure according to another exemplary embodiment. In this manner, the time-dependent PL intensity change in the glass/QD structure (a comparative example), the SIZO/QD structure (an exemplary embodiment), and the SIZO/QD/SIZO structure (another exemplary embodiment) is measured.

Referring to FIG. 10, it may be seen that the curve for the SIZO/QD structure (an exemplary embodiment) is located considerably below the curve for the glass/QD structure (a comparative example). When the SIZO substrate is used instead of the glass substrate, since the charge may be easily transferred from the quantum dot (QD) layer to the SIZO, the PL lifetime may be reduced. Also, it may be seen that the curve for the SIZO/QD/SIZO structure (another exemplary embodiment) is located below the curve for the SIZO/QD structure (an exemplary embodiment). When the quantum dot (QD) layer is embedded in the semiconductor (SIZO), and the charge separation and the charge transmission to the semiconductor (SIZO) may be efficiently performed and thus the PL lifetime may be further reduced. From this result, it may be seen that excellent photoelectrical characteristics may occur in the structure in which the quantum dot layer contacts the semiconductor layer and in the structure in which the quantum dot layer is embedded in the semiconductor layer.

For example, a photoelectric device which absorbs and thereby detects light corresponding to any one of red (R), green (G), blue (B), and infrared (IR) light may be implemented by using the structure described with reference to FIGS. 1, 2, and 7 to 9. The wavelength bands of the light absorbed by the quantum dot layers QL1 and QL10 to QL13 may vary according to the materials, configurations, and/or sizes of the quantum dot layers QL1 and QL10 to QL13. Thus, a unit photoelectric device suitable for absorbing and thereby detecting a red (R) light, a unit photoelectric device suitable for absorbing and thereby detecting a green (G) light, a unit photoelectric device suitable for absorbing and thereby detecting absorbing a blue (B) light, and a unit photoelectric device suitable for absorbing and thereby detecting absorbing an infrared (IR) light may be implemented. Also, a device for absorbing and thereby detecting light of different wavelengths may be implemented by combining a plurality of different unit photoelectric devices. This will be described below in more detail with reference to FIGS. 12 and 13. Prior to this, with reference to FIG. 11, a description will be given of a photoelectric device according to a comparative example that may be compared with the exemplary embodiments of FIGS. 12 and 13.

Figure 11:
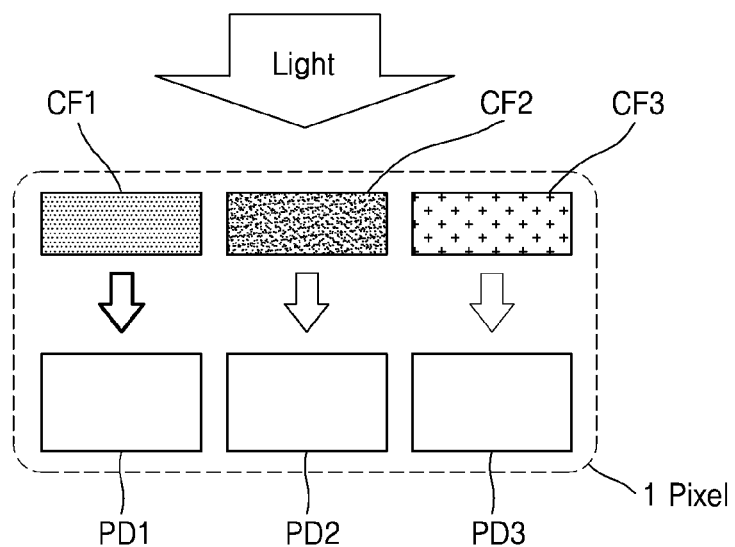
FIG. 11 is a conceptual diagram illustrating a photodetection unit corresponding to one pixel according to a comparative example.

FIG. 11 is a conceptual diagram illustrating a photodetection unit corresponding to one pixel according to a comparative example. The photodetection unit of FIG. 11 may be a unit pixel of a conventional CMOS image sensor. The unit pixel may be an RGB pixel.

Referring to FIG. 11, a plurality of photodiodes PD1, PD2, and PD3 may be arranged in a horizontal direction, and a plurality of color filters CF1, CF2, and CF3 may be arranged to correspond to the photodiodes PD1, PD2, and PD3, respectively. The photodiodes PD1, PD2, and PD3 may include a first photodiode PD1, a second photodiode PD2, and a third photodiode PD3. The first, second, and third photodiodes PD1, PD2, and PD3 may be the same devices. The color filters CF1, CF2, and CF3 may include a first color filter CF1, a second color filter CF2, and a third color filter CF3. The first color filter CF1 and the first photodiode PD1 corresponding thereto may be referred to as constituting a first subpixel, a second color filter CF2 and the second photodiode PD2 corresponding thereto may be referred to as constituting a second subpixel, and a third color filter CF3 and the third photodiode PD3 corresponding thereto may be referred to as constituting a third subpixel. The first color filter CF1 may be configured to transmit red (R) light and block other light, the second color filter CF2 may be configured to transmit green (G) light and block other light, and the third color filter CF3 may be configured to transmit blue (B) light and block other light. The wavelengths of the light incident on the photodiodes PD1, PD2, and PD3 may be determined by the corresponding color filters CF1, CF2, and CF3, respectively. In other words, the photodetection unit according to the comparative example may perform photodetection in a passive manner.

When photodetection is performed in this manner by using the color filters CF1, CF2, and CF3, there may occur a light crossover phenomenon in which the light penetrating the color filter (e.g., CF2) is incident on an adjacent photodiode (e.g., PD1 or PD3) other than the photodiode (e.g., PD2) corresponding thereto. Also, the light penetrating the color filters CF1, CF2, and CF3 may cause light scattering at a wall (or barrier) (not illustrated) provided between the photodiodes PD1, PD2, and PD3. The light crossover and/or the light scattering may cause an image blur phenomenon. When the integration degree and resolution of this photodetection unit increase, since the size of each of the photodiodes PD1, PD2, and PD3 decreases and the distance therebetween decreases, the problem caused by the light crossover and the light scattering may become serious. Also, when the integration degree and resolution of this photodetection unit increase, the sizes of the photodiodes PD1, PD2, and PD3 in the pixel are reduced, and thus, various limits and problems may be caused, such as fill factor reduction and optical gain reduction.

If the color filters CF1, CF2, and CF3 are formed to include quantum dots, the thickness of each of the color filters CF1, CF2, and CF3 may need to be increased to about 10 μm or more in order to secure excellent filtering characteristics. In this case, the total device size (thickness) may increase, and the manufacturing cost thereof may increase.

Figure 12:
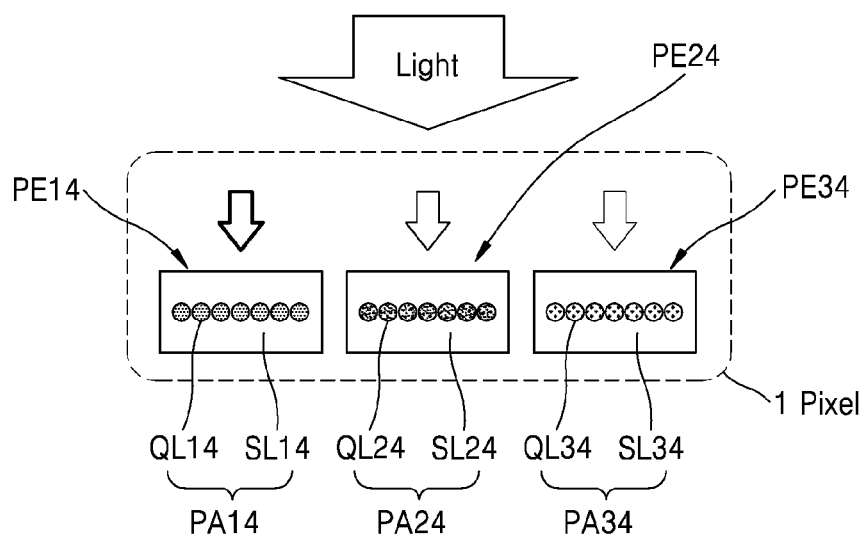
FIG. 12 is a schematic cross-sectional view illustrating a photoelectric device including a plurality of photoelectric conversion elements according to an exemplary embodiment.

FIG. 12 is a schematic cross-sectional view illustrating a photoelectric device including a plurality of photoelectric conversion elements according to an exemplary embodiment. The photoelectric device of the present exemplary embodiment has a horizontal arrangement structure, also referred to as a lateral arrangement structure.

Referring to FIG. 12, a plurality of photoelectric conversion elements, for example, a first photoelectric conversion element PE14, a second photoelectric conversion element PE24, and a third photoelectric conversion element PE34 may be arranged to be spaced apart from each other in a horizontal direction. The first photoelectric conversion element PE14 may include a first photoactive layer PA14, the second photoelectric conversion element PE24 may include a second photoactive layer PA24, and the third photoelectric conversion element PE34 may include a third photoactive layer PA34. The first to third photoactive layers PA14, PA24, and PA34 may have an identical or similar configuration to the photoactive layers PA1 and PA10 described with reference to FIGS. 1 and 2. In more detail, the first photoactive layer PA14 may include a first quantum dot layer QL14 and a first semiconductor layer SL14. The first quantum dot layer QL14 may generate a charge in response to light, and the first semiconductor layer SL14 may provide a channel for transferring the charge generated by the first quantum dot layer QL14. The first quantum dot layer QL14 may be embedded in the first semiconductor layer SL14. The materials and characteristics of the first quantum dot layer QL14 and the first semiconductor layer SL14 may be identical or similar to those of the quantum dot layers QL1 and QL10 and the semiconductor layers SL1 and SL10 described with reference to FIGS. 1 and 2. Like the first photoactive layer PA14, the second photoactive layer PA24 may include a second quantum dot layer QL24 and a second semiconductor layer SL24, and the third photoactive layer PA34 may include a third quantum dot layer QL34 and a third semiconductor layer SL34.

The first quantum dot layer QL14, the second quantum dot layer QL24, and the third quantum dot layer QL34 may be different from each other in terms of the materials, configurations, and/or sizes thereof. In this regard, the first quantum dot layer QL14 may be configured to absorb and thereby detect light corresponding to any one of red (R), green (G), blue (B), and infrared (IR) light, the second quantum dot layer QL24 may be configured to absorb and thereby detect light corresponding to another one of R, G, B, and IR light, and the third quantum dot layer QL34 may be configured to absorb and thereby detect light corresponding to another one of R, G, B, and IR light. For example, the first quantum dot layer QL14 may be configured to absorb and thereby detect red (R) light, the second quantum dot layer QL24 may be configured to absorb and thereby detect green (G) light, and the third quantum dot layer QL34 may be configured to absorb and thereby detect blue (B) light. In other words, the first photoelectric conversion element PE14 may be configured to absorb and thereby detect red (R) light, the second photoelectric conversion element PE24 may be configured to absorb and thereby detect green (G) light, and the third photoelectric conversion element PE34 may be configured to absorb and thereby detect blue (B) light. In this case, the structure of FIG. 12 may be one RGB pixel, and each of the photoelectric conversion elements PE14, PE24, and PE34 may be a subpixel.

Although not illustrated, each of the photoelectric conversion elements PE14, PE24, and PE34 may further include two electrodes contacting each of the photoactive layers PA14, PA24, and PA34 corresponding thereto. The two electrodes may correspond to the first and second electrodes E1 and E2 of FIG. 1 or may correspond to the first and second electrodes E10 and E20 of FIG. 2. Also, each of the photoelectric conversion elements PE14, PE24, and PE34 may further include a gate electrode for applying an electric field to each of the photoactive layers PA14, PA24, and PA34 corresponding thereto. The gate electrode may correspond to each of the gate electrodes G10, G11, G12, and G13 of FIGS. 2 and 7 to 9. In this case, each of the photoelectric conversion elements PE14, PE24, and PE34 may be a phototransistor.

In the present exemplary embodiment, the wavelength band of the light absorbed and thereby detected by each of the photoelectric conversion elements PE14, PE24, and PE34 may be determined without a separate color filter by each of the quantum dot layers QL14, QL24, and QL34 provided in each of the photoelectric conversion elements PE14, PE24, and PE34. In other words, the photoelectric device according to the present exemplary embodiment may perform photodetection in an active manner. Thus, the photoelectric device according to the present exemplary embodiment may be referred to as a color filter-less structure, that is, a structure that does not require a separate color filter.

In addition, since each of the quantum dot layers QL14, QL24, and QL34 may have a very small thickness, a photoelectric device having an excellent light transmittance and a small total thickness may be implemented. For example, when each of the quantum dot layers QL14, QL24, and QL34 has a monolayer structure including a plurality of quantum dots, the thickness thereof may be as small as about 6 nm or less. This may be a relatively very small thickness in comparison with the thickness of the color filters CF1, CF2, and CF3 described with reference to FIG. 11.

Figure 13:
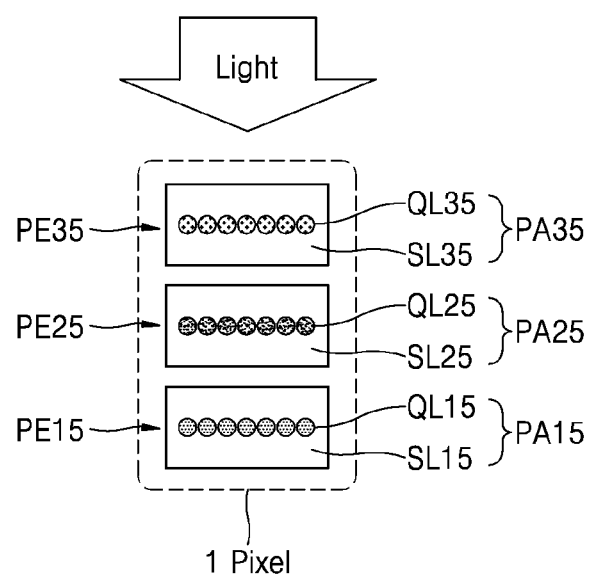
FIG. 13 is a schematic cross-sectional view illustrating a photoelectric device including a plurality of photoelectric conversion elements according to another exemplary embodiment.

FIG. 13 is a schematic cross-sectional view illustrating a photoelectric device including a plurality of photoelectric conversion elements according to another exemplary embodiment. The photoelectric device of the present exemplary embodiment has a vertical arrangement structure, that is, a stack structure.

Referring to FIG. 13, a plurality of photoelectric conversion elements, for example, a first photoelectric conversion element PE15, a second photoelectric conversion element PE25, and a third photoelectric conversion element PE35 may be stacked in a vertical direction. The first photoelectric conversion element PE15, the second photoelectric conversion element PE25, and the third photoelectric conversion element PE35 may be similar, respectively, to the first photoelectric conversion element PE14, the second photoelectric conversion element PE24, and the third photoelectric conversion element PE34 of FIG. 12. The first photoelectric conversion element PE15 may include a first quantum dot layer QL15 and a first semiconductor layer SL15, the second photoelectric conversion element PE25 may include a second quantum dot layer QL25 and a second semiconductor layer SL25, and the third photoelectric conversion element PE35 may include a third quantum dot layer QL35 and a third semiconductor layer SL35. Although not illustrated, each of the photoelectric conversion elements PE15, PE25, and PE35 may further include two electrodes contacting each of photoactive layers PA15, PA25, and PA35 corresponding thereto. Also, the photoelectric device may further include at least one gate electrode for applying an electric field to at least one of the photoactive layers PA15, PA25, and PA35.

The first photoelectric conversion element PE15 may be configured to absorb and thereby detect light corresponding to any one of red (R), green (G), blue (B), and infrared (IR) light, the second photoelectric conversion element PE25 may be configured to absorb and thereby detect light corresponding to another one of R, G, B, and IR light, and the third photoelectric conversion element PE35 may be configured to absorb and thereby detect light corresponding to another one of R, G, B, and IR light. For example, the structure of FIG. 13 may be one RGB pixel.

According to the present exemplary embodiment, since the photoelectric conversion elements PE15, PE25, and PE35 are stacked in the vertical direction, the width of a region corresponding to one pixel may be reduced to about ⅓ or less in comparison with the case of FIGS. 11 and 12. When the structure of FIGS. 11 and 12 is referred to as including a horizontal array of subpixels, the structure of FIG. 13 may constitute one pixel without such a horizontal array of subpixels. In this respect, the structure of FIG. 13 may be referred to as a subpixel-less structure, that is, a structure without a subpixel. The structure of FIG. 13 may be a subpixel-less structure while being a color filter-less structure. Also, the structure of FIG. 13 may be referred to as a multi-wavelength or a multi-band (e.g., RGB) subpixel-less structure.

As described with reference to FIGS. 12 and 13, according to the exemplary embodiments, a photoelectric device performing a photoelectric conversion on a light of a certain wavelength in an active manner without a color filter may be implemented. Thus, various limits and problems caused by the use of a color filter may be fundamentally prevented. For example, a device having a high integration and resolution may be easily implemented without the problem caused by light crossover or light scattering. Also, since a plurality of photoelectric conversion elements (e.g., PE15, PE25, and PE35 of FIG. 13) may have excellent light transmittance, a photoelectric device having the subpixel-less structure of FIG. 13 may be implemented by stacking the photoelectric conversion elements in the vertical direction. In this case, the width of a photoelectric device corresponding to one pixel may be greatly reduced.

Also, the photoelectric devices according to the exemplary embodiments may have a high responsivity, a high photoconductive gain, and a high sensitivity. For example, the photoelectric devices according to the exemplary embodiments may have a photoconductive gain of about thousands or more or 10000 or more. This may be about tens of times or about 100 times greater than the photoconductive gain (about 1 to about 100) of an existing photodiode. Thus, even when the size of photoelectric device is reduced, a high optical gain may be obtained, and a high integration and resolution may be easily implemented. Also, since a separate amplifier device (amplifier transistor) need not be used, the size and number of devices in a driving unit or other peripheral circuit unit may be reduced and the fill factor thereof may be increased.

Also, when the photoelectric devices according to the exemplary embodiments are applied to camera image sensors, since the performance of the photoelectric devices is excellent, a lens system may be easily designed and processed in relation to chromatic aberration correction or the like. Thus, the number of lenses used in a lens system may be reduced and the size of a camera may be reduced accordingly. Also, the focal length, viewing angle, and/or total track length (TTL) of a lens system may be easily controlled and improved.

Also, the photoelectric devices according to the exemplary embodiments may have an excellent spectral property, a high spectral efficiency, and excellent wavelength selectivity. In addition, since the absorption wavelength range thereof may be easily controlled by adjusting the material composition and/or the size of the quantum dot, the characteristics of the photoelectric devices and the electronic apparatuses including the same may be easily controlled and the performance thereof may be easily improved.

Figure 14:
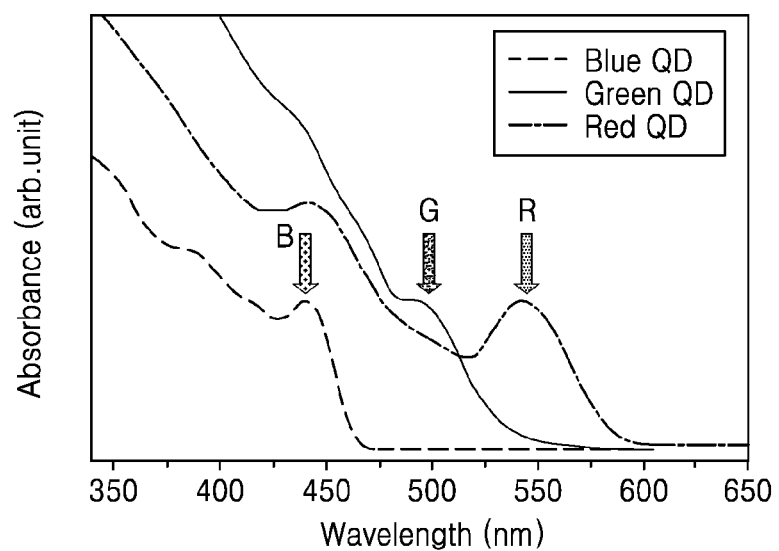
FIG. 14 is a graph illustrating an absorption spectrum of various quantum dot layers that may utilized in photoelectric devices according to exemplary embodiments.

FIG. 14 is a graph illustrating an absorption spectrum of various quantum dot layers that may be utilized in photoelectric devices according to exemplary embodiments. FIG. 14 illustrates an absorption spectrum for each of a red quantum dot (QD) layer configured to absorb red (R) light, a green QD layer configured to absorb green (G) light, and a blue QD layer configured to absorb blue (B) light.

Referring to FIG. 14, it may be seen that the red QD layer has a relatively high absorbance for wavelengths of about 550 nm to about 570 nm and has almost no absorbance for wavelengths of about 600 nm or more. Also, it may be seen that the green QD layer has a relatively high absorbance for wavelengths of about 500 nm to about 520 nm and has almost no absorbance for wavelengths of about 540 nm or more. Also, it may be seen that the blue QD layer has a relatively high absorbance for wavelengths of about 430 nm to about 450 nm and has almost no absorbance for wavelengths of about 450 nm or more. From this, the absorption wavelength selectivity of each quantum dot layer (red QD layer, green QD layer, or blue QD layer) may be identified.

The quantum dot layer (red QD layer, green QD layer, or blue QD layer) may function as an excellent cutoff filter, and the absorption wavelength range thereof may be easily controlled by adjusting the material composition and/or the size of the quantum dot. In the case of the existing color filter, a conversion width (wavelength width) between the maximum point (100%) and the minimum point (0%) of the R/G/B absorption spectrum is as large as about 50 nm to about 100 nm, and there is an overlap portion between the peaks of the R/G/B absorption spectrums. However, in the case of the quantum dot layer, a conversion width of the absorption spectrum is as small as about 30 nm to about 50 nm, and it may have an excellent cutoff function. For example, in the case of the blue quantum dot (QD) layer, since the absorbance thereof decreases from about 440 nm and becomes about 0 at about 470 nm, the conversion width thereof may be referred to as being about 30 nm. Also, in the case of the existing color filter, the absorption wavelength range control is not easy. However, in the case of the quantum dot layer, the absorption wavelength range may be easily controlled by adjusting the material composition and/or the size of the quantum dot. Therefore, in the case of using the quantum dot layer in various exemplary embodiments, an excellent spectral property and high spectral efficiency may be secured, and the spectral property thereof may be easily controlled.

Figures 15A, 15B:
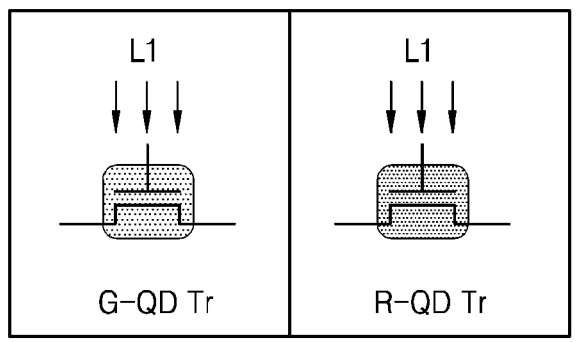
FIGS. 15A and 15B are circuit diagrams illustrating examples of phototransistors according to exemplary embodiments.

FIGS. 15A and 15B are circuit diagrams illustrating examples of phototransistors according to exemplary embodiments.

FIG. 15A is a circuit diagram of a green quantum dot phototransistor G-QD Tr, that is, a phototransistor for absorbing and thereby detecting green (G) light according to an exemplary embodiment. FIG. 15B is a circuit diagram of a red quantum dot phototransistor R-QD Tr, that is, a phototransistor for absorbing and thereby detecting red (R) light according to another exemplary embodiment. In a state in which no light is incident on the phototransistor G-QD Tr or R-QD Tr of FIG. 15, the gate voltage Vg-drain current Id characteristics of the phototransistor G-QD Tr or R-QD Tr are evaluated, and also, in a state in which light L1 is incident on the phototransistor, the gate voltage Vg-drain current Id characteristics thereof are evaluated. The results thereof are illustrated in FIG. 16.

Figure 16:
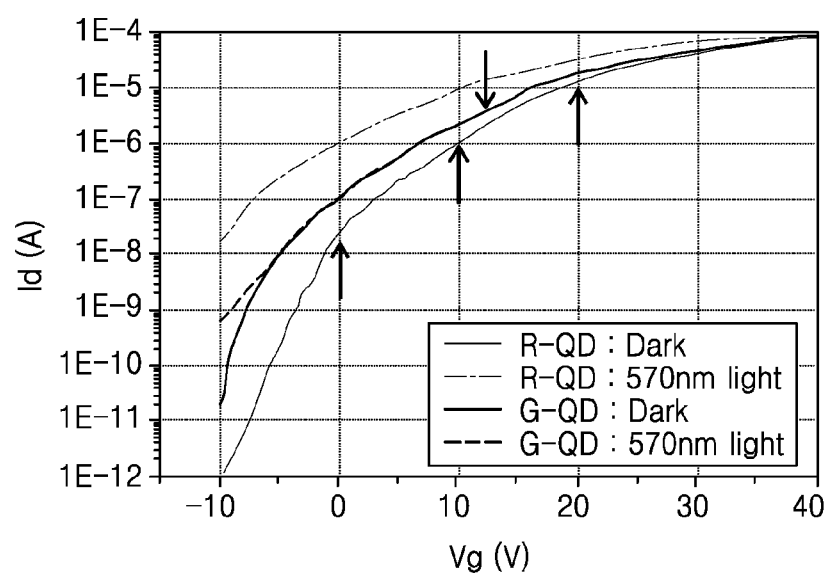
FIG. 16 is a graph illustrating a gate voltage Vg and drain current Id characteristic change according to whether light is incident on the phototransistors of FIG. 15.

Referring to FIG. 16, it may be seen that in a case of irradiating the red quantum dot phototransistor R-QD Tr with light with a wavelength of about 570 nm, the curve changes greatly in comparison with a curve illustrating the phototransistor in a "Dark" state. On the other hand, it may be seen that in a case of irradiating the green quantum dot phototransistor G-QD Tr with light with a wavelength of about 570 nm, the curve changes very little in comparison with a curve illustrating the phototransistor in the "Dark" state. This means that only the red quantum dot phototransistor R-QD Tr responds to light with a wavelength of about 570 nm and the green quantum dot phototransistor G-QD Tr does not respond to light with a wavelength of about 570 nm. This result represents the wavelength selectivity of the phototransistors G-QD Tr and R-QD Tr according to exemplary embodiments. Four arrows illustrated in FIG. 16 indicate points corresponding to some gate voltages Vg used in FIGS. 18 and 19 that will be described later.

An inverter circuit may be constructed by using the two phototransistors G-QD Tr and R-QD Tr illustrated in FIG. 15, and the wavelength selectivity of the phototransistors G-QD Tr and R-QD Tr may be verified by using the inverter circuit. This will be described below in more detail with reference to FIGS. 17 to 19.

Figure 17:
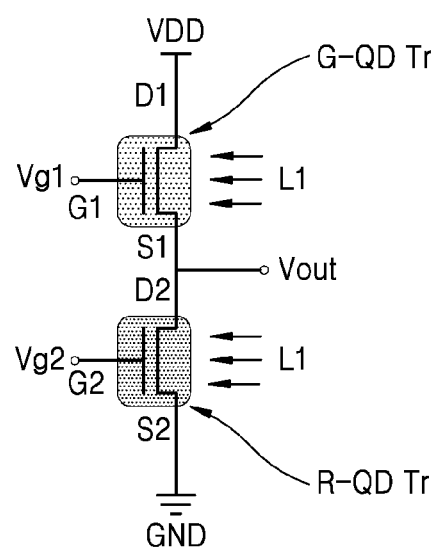
FIG. 17 is a circuit diagram illustrating an inverter circuit including the phototransistors of FIG. 15.

FIG. 17 is a circuit diagram illustrating an inverter circuit including two phototransistors G-QD Tr and R-QD Tr of FIG. 15.

Referring to FIG. 17, a green quantum dot phototransistor (hereinafter referred to as "first transistor") G-QD Tr and a red quantum dot phototransistor (hereinafter referred to as "second transistor") R-QD Tr may be connected to each other to construct an inverter circuit. A source electrode S1 of the first transistor G-QD Tr and a drain electrode D2 of the second transistor R-QD Tr may be connected to each other. The source electrode S1 of the first transistor G-QD Tr and the drain electrode D2 of the second transistor R-QD Tr may be connected in common to an output terminal Vout. A drain electrode D1 of the first transistor G-QD Tr may be connected to a power supply voltage VDD. A source electrode S2 of the second transistor R-QD Tr may be connected to a ground terminal GND. A first gate voltage Vg1 may be applied to a gate electrode G1 of the first transistor G-QD Tr, and a second gate voltage Vg2 may be applied to a gate electrode G2 of the second transistor R-QD Tr.

Light L1 may be irradiated onto the first transistor G-QD Tr and the second transistor R-QD Tr. The light L1 may have the same wavelength as used in FIG. 16, that is, a wavelength of about 570 nm. The characteristics of only the second transistor R-QD Tr, among the first and second transistors G-QD Tr and R-QD Tr, may be selectively changed by the light L1. This may be the same as described with reference to FIG. 16. Thus, a signal of the output terminal Vout may vary according to whether the light L1 is irradiated. When the light L1 is irradiated, a signal of the output terminal Vout (i.e., an output signal) may be at a low level; and when the light L1 is not irradiated, the output signal may be at a high level. When the light L1 is referred to as an input signal, the output signal may be at a low level when the input signal is at a high level; and the output signal may be at a high level when the input signal is at a low level. Thus, the circuit of FIG. 17 may operate as an inverter.

Figure 18:
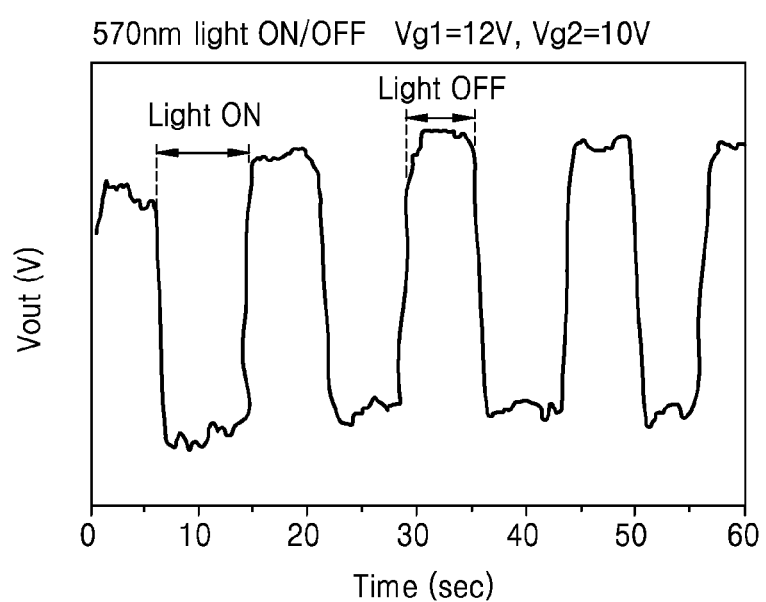
FIG. 18 is a graph illustrating a result of measuring a change in an output signal (output voltage) while alternately repeating an operation of irradiating light onto the inverter circuit of FIG. 17 and an operation of not irradiating light thereon.

FIG. 18 is a graph illustrating a result of measuring a change in the voltage of the output signal (output voltage) while alternately repeating an operation of irradiating the light L1 onto the inverter circuit of FIG. 17 and an operation of not irradiating the light L1 thereon. The light L1 used herein has a wavelength of about 570 nm. The first gate voltage Vg1 is about 12 V, and the second gate voltage Vg2 is about 10 V.

Referring to FIG. 18, an output voltage Vout of a low level is measured in an ON operation in which the light L1 is irradiated, and an output voltage Vout of a high level is measured in an OFF operation in which the light L1 is not irradiated. This may result when the characteristics of the second transistor R-QD Tr are selectively changed according to whether the light L1 is irradiated.

Figure 19:
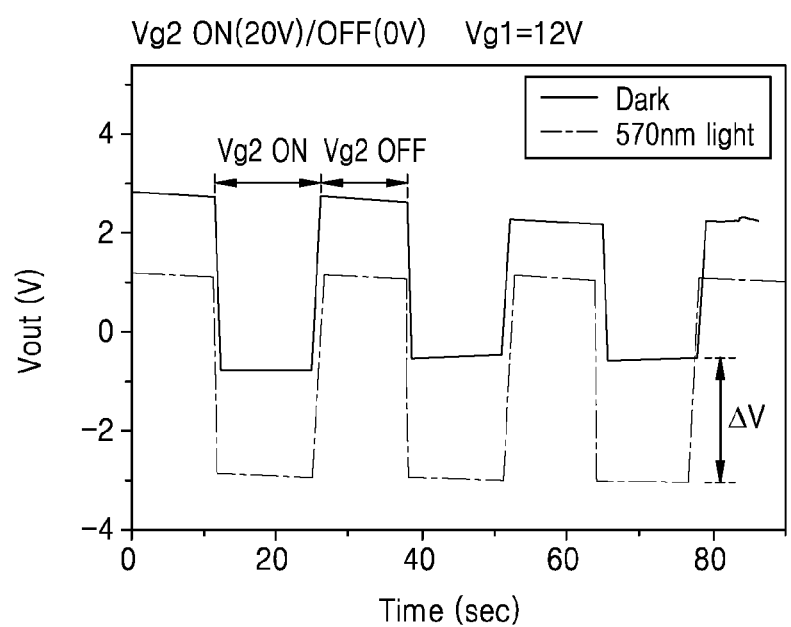
FIG. 19 is a graph illustrating a result of measuring a change in an output signal (output voltage) while turning on and off a gate voltage (second gate voltage) Vg2 of a second transistor in a case in which light is incident on inverter circuit of FIG. 17 and a case in which light is not incident thereon.

FIG. 19 is a graph illustrating a result of measuring a change in the output signal (output voltage) while turning on and off the gate voltage (i.e., the second gate voltage) Vg2 of the second transistor R-QD Tr in a case in which light is incident on the inverter circuit of FIG. 17 and a case in which light is not incident thereon. The light L1 used herein has a wavelength of about 570 nm. The first gate voltage Vg1 is about 12 V, and the second gate voltage Vg2 is turned on and off between about 20 V (ON) and about 0 V (OFF).

Referring to FIG. 19, it may be seen that the inverter operation characteristics occur according turning on and off of the second gate voltage Vg2 even in the "Dark" state in which the light L1 is not irradiated. It may be seen that in the state of irradiating the light L1, the inverter operation characteristics occur at a different voltage level from the "Dark" state. A voltage level difference (i.e., ΔV) between a case in which the light L1 is not irradiated (Light Off) (i.e., "Dark") and a case in which the light L1 is irradiated (Light On) may be caused by the characteristic change of the second transistor R-QD Tr by the light L1. The ΔV may correspond to the voltage level difference between the "Light ON" state and the "Light OFF" state of FIG. 18.

From the results of FIGS. 18 and 19, the wavelength selectivity of the phototransistors (G-QD Tr and R-QD Tr of FIGS. 15 and 17) according to the exemplary embodiments may be identified.

Figure 20:
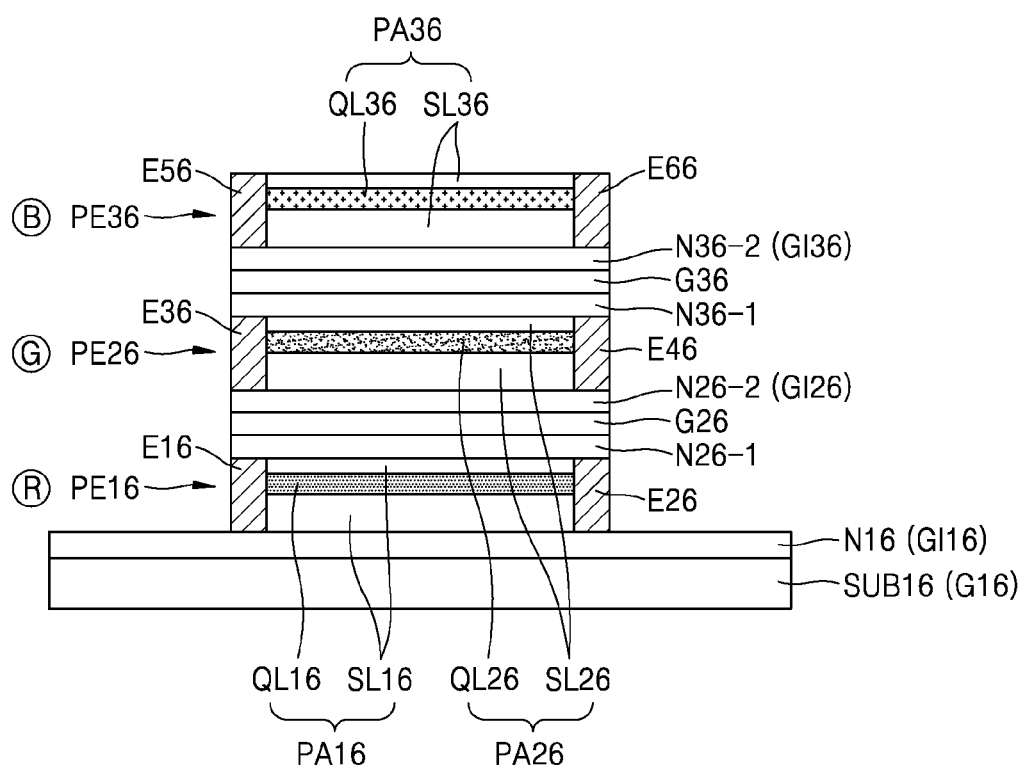
FIG. 20 is a cross-sectional view illustrating a photoelectric device having a stacked structure according to another exemplary embodiment.

FIG. 20 is a cross-sectional view illustrating a photoelectric device having a stacked structure according to another exemplary embodiment. The present exemplary embodiment illustrates a specific example of the photoelectric device described with reference to FIG. 13.

Referring to FIG. 20, a plurality of photoelectric conversion elements (hereinafter also referred to as "photoelectric elements") may be stacked on a substrate SUB16. The photoelectric elements may include, for example, a first photoelectric element PE16, a second photoelectric element PE26, and a third photoelectric element PE36. The first to third photoelectric elements PE16, PE26, and PE36 may be similar respectively to the first to third photoelectric conversion elements PE15, PE25, and PE35 described with reference to FIG. 13. A first photoactive layer PA16 of the first photoelectric element PE16 may include a first quantum dot layer QL16 and a first semiconductor layer SL16, a second photoactive layer PA26 of the second photoelectric element PE26 may include a second quantum dot layer QL26 and a second semiconductor layer SL26, and a third photoactive layer PA36 of the third photoelectric element PE36 may include a third quantum dot layer QL36 and a third semiconductor layer SL36. Although the first quantum dot layer QL16, the second quantum dot layer QL26, and the third quantum dot layer QL36 are illustrated as being embedded, respectively, in the first semiconductor layer SL16, the second semiconductor layer SL26, and the third semiconductor layer SL36, this is merely exemplary and non-embedded structures may also be possible. Also, the photoelectric element PE16/PE26/PE36 may include two electrodes E16 and E26, E36 and E46, and E56 and E66 contacting different regions of the photoactive layers PA16, PA26, PA36 corresponding thereto. The two electrodes E16 and E26 contacting the first photoactive layer PA16 will be referred to as a first electrode E16 and a second electrode E26 respectively, the two electrodes E36 and E46 contacting the second photoactive layer PA26 will be referred to as a third electrode E36 and a fourth electrode E46 respectively, and the two electrodes E56 and E66 contacting the third photoactive layer PA36 will be referred to as a fifth electrode E56 and a sixth electrode E66 respectively. The first photoelectric element PE16 may be configured to absorb and thereby detect, for example, red (R) light; the second photoelectric element PE26 may be configured to absorb and thereby detect, for example, green (G) light; and the third photoelectric element PE36 may be configured to absorb and thereby detect, for example, blue (B) light. However, the order in which the first to third photoelectric elements PE16, PE26, and PE36 is stacked may vary according other exemplary embodiments.

The photoelectric device of the present exemplary embodiment may further include at least one gate electrode for applying an electric field to at least one of the photoelectric elements PE16, PE26, and PE36. For example, the substrate SUB16 may be used as a first gate electrode G16. A second gate electrode G26 may be further provided between the first photoelectric element PE16 and the second photoelectric element PE26. A third gate electrode G36 may be further provided between the second photoelectric element PE26 and the third photoelectric element PE36. A first insulating layer N16 may be provided between the first gate electrode G16 and the first photoelectric element PE16, and may be used as a first gate insulating layer GI16. A (2-1)th insulating layer N26-1 and a (2-2)th insulating layer N26-2 may be provided between the first photoelectric element PE16 and the second photoelectric element PE26, and the second gate electrode G26 may be provided therebetween. A (3-1)th insulating layer N36-1 and a (3-2)th insulating layer N36-2 may be provided between the second photoelectric element PE26 and the third photoelectric element PE36, and the third gate electrode G36 may be provided therebetween. The (2-2)th insulating layer N26-2 may be referred to as a second gate insulating layer GI26, and the (3-2)th insulating layer N36-2 may be referred to as a third gate insulating layer GI36. Although the (2-1)th insulating layer N26-1 and the (2-2)th insulating layer N26-2 are illustrated as having the same thickness, they may have different thicknesses. For example, the (2-2)th insulating layer N26-2 may be thinner than the (2-1)th insulating layer N26-1. Also, although the (3-1)th insulating layer N36-1 and the (3-2)th insulating layer N36-2 are illustrated as having the same thickness, they may have different thicknesses. For example, the (3-2)th insulating layer N36-2 may be thinner than the (3-1)th insulating layer N36-1. The (2-1)th insulating layer N26-1, the (2-2)th insulating layer N26-2, the (3-1)th insulating layer N36-1, and the (3-2)th insulating layer N36-2 may be formed to include, for example, a transparent insulating material such as a silicon oxide or a silicon nitride, any other dielectric material, and/or a transparent insulating polymer material. The second gate electrode G26 and the third gate electrode G36 may each be formed to include a transparent conductive oxide (TCO) such as an indium tin oxide (ITO), and/or any other transparent conductive material. Since graphene has an excellent light transmittance, it may also be used as the material of the second and third gate electrodes G26 and G36. The graphene may have an excellent flexibility, and may be formed to have a very small thickness. Also, the second gate electrode G26 and the third gate electrode G36 may each be formed to include a transparent conductive polymer material.

At least one of the first gate electrode G16, the second gate electrode G26, and the third gate electrode G36 may be omitted. Only two or one of the three gate electrodes G16, G26, and G36 may be used. As an example, only the first gate electrode G16 may be used to apply an electric field to the first to third photoactive layers PA16, PA26, and PA36.

The thickness of each of the first to third photoactive layers PA16, PA26, and PA36 may be about 150 nm or less or about 100 nm or less. For example, the thickness of each of the first to third photoactive layers PA16, PA26, and PA36 may be about 10 nm to about 100 nm. The total thickness of a stack structure of the photoelectric device provided on the first insulating layer N16 of the substrate SUB16 may be about 500 nm or less, about 300 nm or less, or about 200 nm or less. The total thickness of the stacked structure may vary according to whether the second and third gate electrodes G26 and G36 are included. However, in some case, the thickness of each of the first to third photoactive layers PA16, PA26, and PA36 may be more than about 150 nm; and in this case, the total thickness of the stacked structure may increase to more than about 500 nm.

Figure 21:
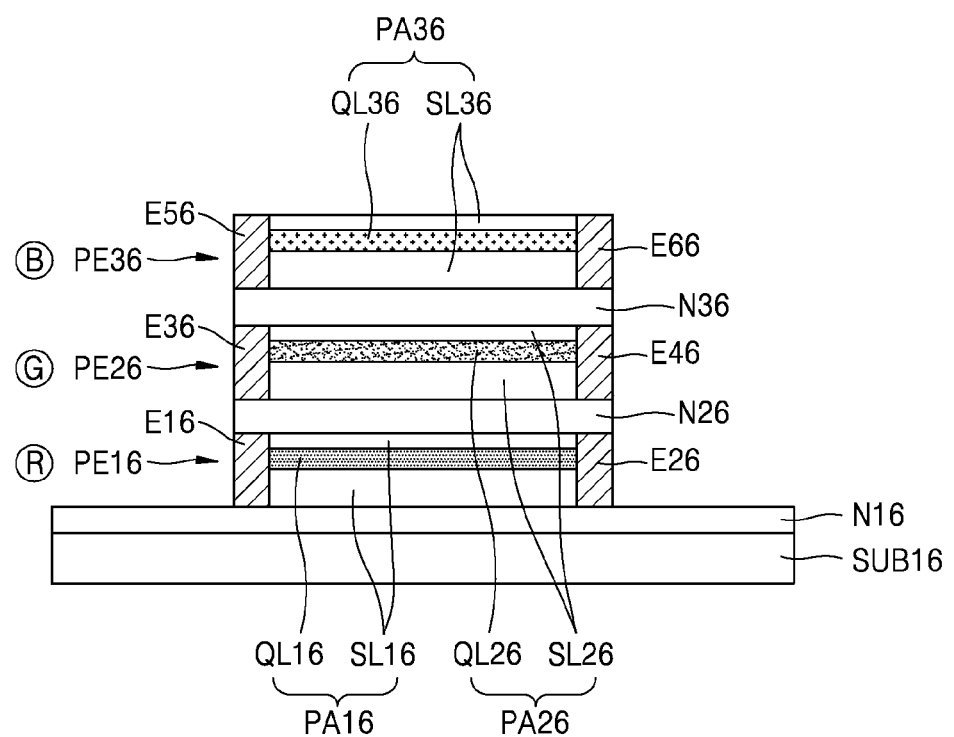
FIG. 21 is a cross-sectional view illustrating a photoelectric device according to another exemplary embodiment.

FIG. 21 illustrates a case in which a gate electrode is not used between the first photoelectric element PE16 and the second photoelectric element PE26 and between the second photoelectric element PE26 and the third photoelectric element PE36. As illustrated in FIG. 21, a second insulating layer N26 may be provided between the first photoelectric element PE16 and the second photoelectric element PE26, and a third insulating layer N36 may be provided between the second photoelectric element PE26 and the third photoelectric element PE36. If necessary, a substrate SUB16 may be used as a gate electrode.

In FIGS. 20 and 21, the first photoelectric element PE16, the second photoelectric element PE26, and the third photoelectric element PE36 may correspond to red (R) light, a green (G) light, and a blue (B) light respectively. That is, the stacked structure thereof may have the order of R/G/B from the substrate SUB16. This stacked order may be based on the size of an energy band gap for light absorption. The energy band gap for light absorption may increase as R→G→B element (QD). Thus, if the light is incident from above the stacked structure of FIGS. 20 and 21, when the arrangement on the substrate SUB16 has the order of R/G/B, the light absorption efficiency thereof may be maximized and also the light penetration efficiency thereof may be maximized.

However, the arrangement order of R/G/B may vary according to other exemplary embodiments. For example, based on the responsivity levels thereof, the photoelectric elements PE16, PE26, and PE36 may be arranged in the order of B/R/G on the substrate SUB16. An example thereof is illustrated in FIG. 22.

Figure 22:
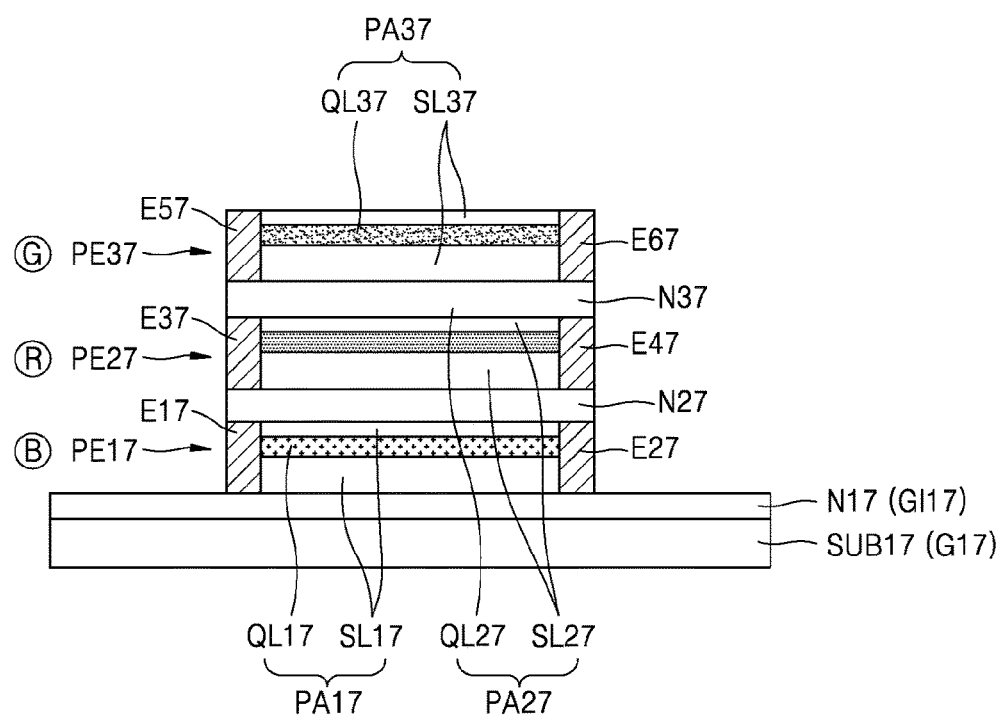
FIG. 22 is a cross-sectional view illustrating a photoelectric device according to another exemplary embodiment.

Referring to FIG. 22, a first photoelectric element PE17 may be configured to absorb and thereby detect blue (B) light, a second photoelectric element PE27 may be configured to absorb and thereby detect red (R) light, and a third photoelectric element PE37 may be configured to absorb and thereby detect green (G) light. That is, the photoelectric device of FIG. 22 may include the elements PE17, PE27, and PE37 arranged in the order of B/R/G on a substrate SUB17. In this case, the substrate SUB17 may be used as a gate electrode G17, and a first insulating layer N17 provided between the gate electrode N17 and the first photoelectric element PE17 may be a gate insulating layer GI17.

The light responsivity thereof may increase as B→R→G element (QD). That is, the first photoelectric element PE17 corresponding to blue (B) light may have a relatively low responsivity, the second photoelectric element PE27 corresponding to red (R) light may have a medium responsivity, and the third photoelectric element PE37 corresponding to green (G) light may have the highest responsivity (see FIG. 27). When the gate electrode G17 is used to apply an electric field to the first to third photoelectric elements PE17, PE27, and PE37, the intensity of the electric field may decrease away from the gate electrode G17. Thus, when the photoelectric elements PE17, PE27, and PE37 are disposed to increase the responsivity thereof away from the gate electrode G17, a compensation effect for an influence change of a gate field may be obtained. For this reason, the photoelectric elements PE17, PE27, and PE37 may be disposed on the substrate SUB17 in ascending order of the responsivity, that is, in the order of B/R/G. In FIG. 22, PA17, PA27, PA37, QL17, QL27, QL37, SL17, SL27, and SL37 denote a first photoactive layer, a second photoactive layer, a third photoactive layer, a first quantum dot layer, a second quantum dot layer, a third quantum dot layer, a first semiconductor layer, a second semiconductor layer, and a third semiconductor layer, respectively. Also, E17, E27, E37, E47, E57, and E67 denote first to sixth electrodes, respectively, and N27 and N37 denote second and third insulating layers, respectively.

Figure 23:
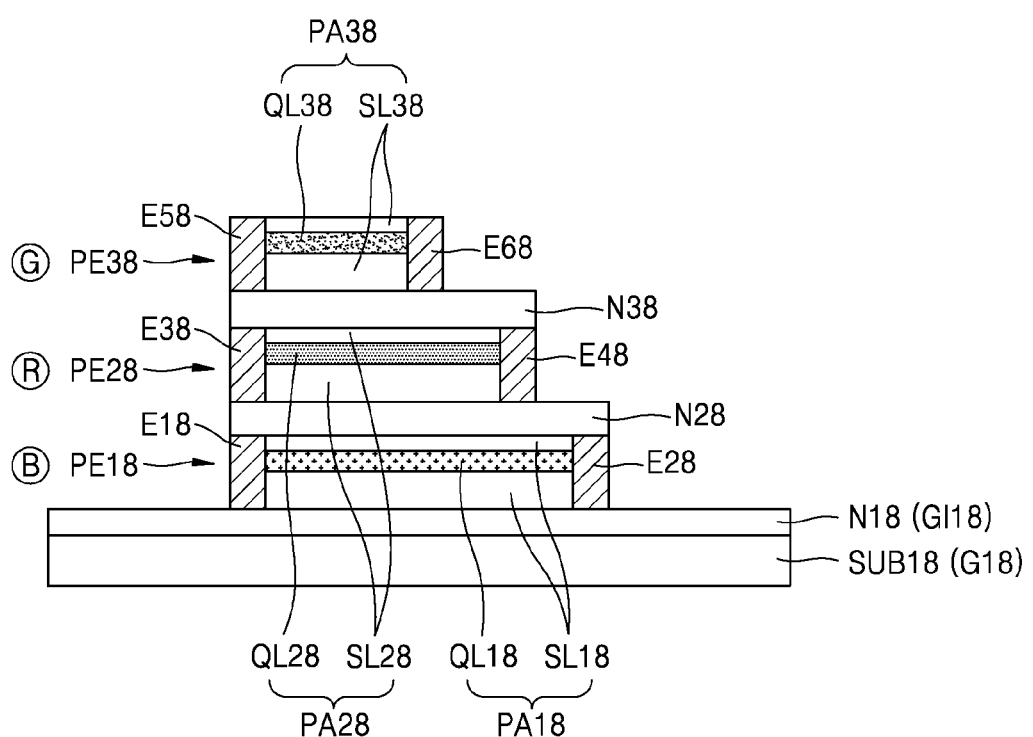
FIG. 23 is a cross-sectional view illustrating a photoelectric device according to another exemplary embodiment.

FIG. 23 is a cross-sectional view illustrating a photoelectric device according to another exemplary embodiment.

Referring to FIG. 23, a first photoelectric element PE18, a second photoelectric element PE28, and a third photoelectric element PE38 may be sequentially stacked on a substrate SUB18. For example, the first photoelectric element PE18 may be configured to absorb and thereby detect blue (B) light, the second photoelectric element PE28 may be configured to absorb and thereby detect red (R) light, and the third photoelectric element PE38 may be configured to absorb and thereby detect green (G) light. At least two of the first to third photoelectric elements PE18, PE28, and PE38 may have different widths. For example, the first photoelectric element PE18 may have a first width, the second photoelectric element PE28 may have a second width smaller than the first width, and the third photoelectric element PE38 may have a third width smaller than the second width. That is, the widths thereof may decrease in ascending order of the first, second, and third photoelectric elements PE18, PE28, and PE38. This width adjustment may be based on the responsivity levels of the photoelectric elements PE18, PE28, and PE38. In other words, the widths of the photoelectric elements PE18, PE28, and PE38 may be adjusted based on the responsivity levels thereof. The element width may increase as the element responsivity decreases. From this, the responsivity difference may be compensated, or other effects may be obtained. If necessary, the substrate SUB18 may be used as a gate electrode G18; and in this case, a first insulating layer N18 may be used as a gate insulating layer GI18. In FIG. 23, PA18, PA28, PA38, QL18, QL28, QL38, SL18, SL28, and SL38 denote a first photoactive layer, a second photoactive layer, a third photoactive layer, a first quantum dot layer, a second quantum dot layer, a third quantum dot layer, a first semiconductor layer, a second semiconductor layer, and a third semiconductor layer, respectively. Also, E18, E28, E38, E48, E58, and E68 denote first to sixth electrodes respectively, and N28 and N38 denote second and third insulating layers, respectively.

In some cases, in FIG. 23, the second photoelectric element PE28 and the third photoelectric element PE38 may be formed to have the same width. Alternatively, the first photoelectric element PE18 and the second photoelectric element PE28 may be formed to have the same width, and the third photoelectric element PE38 may be formed to have a different width. Also, various other modifications thereof may be possible.

Figure 24:
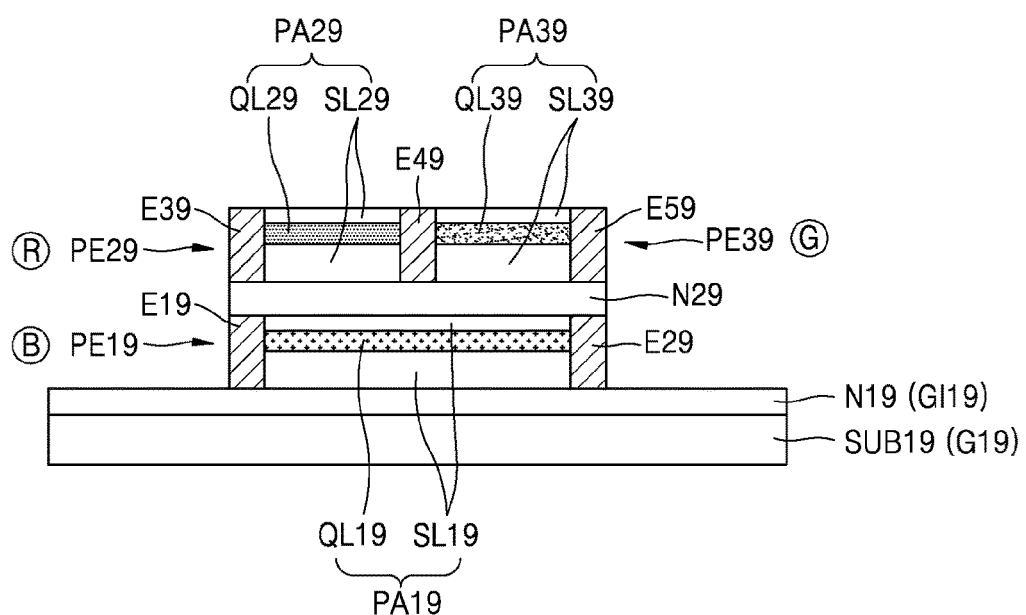
FIG. 24 is a cross-sectional view illustrating a photoelectric device according to another exemplary embodiment.

FIG. 24 is a cross-sectional view illustrating a photoelectric device according to another exemplary embodiment.

Referring to FIG. 24, the widths of photoelectric elements PE19, PE29, and PE39 may be adjusted and the stacked form thereof may be modified. For example, a first photoelectric element PE19 may be provided on a substrate SUB19, and second and third photoelectric elements PE29 and PE39 may be provided in different regions of the first photoelectric element PE19. Thus, the first photoelectric element PE19 may have a larger width than the second and third photoelectric elements PE29 and PE39. The first photoelectric element PE19 may be configured to absorb and thereby detect blue (B) light, the second photoelectric element PE29 may be configured to absorb and thereby detect red (R) light, and the third photoelectric element PE39 may be configured to absorb and thereby detect green (G) light. In the structure of FIG. 24, based on the responsivity levels of the photoelectric elements PE19, PE29, and PE39, the widths thereof may be adjusted and the stack form thereof may be modified. When the substrate SUB19 is used as a gate electrode G19, a gate field of substantially identical or similar intensity may be applied to the second and third photoelectric elements PE29 and PE39. Also, since the structure of FIG. 24 may be referred to as a 2-layered stacked structure, the total device thickness thereof may be smaller than that of a 3-layered stacked structure. The structure of FIG. 24 is merely exemplary, and various other modification structures thereof may be possible. For example, the second photoelectric element PE29 and the third photoelectric element PE39 may have different widths. Also, the total width of the second and third photoelectric elements PE29 and PE39 may be different from the width of the first photoelectric element PE19. Also, various other modifications thereof may be possible.

In FIG. 24, a fourth electrode E49 provided between the second and third photoelectric elements PE29 and PE39 may be a common electrode. The common electrode E49 may be used as a common source electrode. In this case, the common electrode E49 may be grounded. In FIG. 24, PA19, PA29, PA39, QL19, QL29, QL39, SL19, SL29, and SL39 denote a first photoactive layer, a second photoactive layer, a third photoactive layer, a first quantum dot layer, a second quantum dot layer, a third quantum dot layer, a first semiconductor layer, a second semiconductor layer, and a third semiconductor layer, respectively. Also, E19, E29, E39, and E59 denote first, second, third, and fifth electrodes respectively, and N19 and N29 denote first and second insulating layers, respectively. When the substrate SUB19 is used as the gate electrode G19, the first insulating layer N19 may be used as a gate insulating layer GI19.

In the structure of FIGS. 22, 23, and 24, at least one gate electrode may be further provided to apply an electric field to the photoelectric elements (PE17, PE27, and PE37; PE18, PE28, and PE38; and PE19, PE29, and PE39). The at least one gate electrode may be provided below the first photoelectric element PE17/PE18/PE19, for example, in the substrate SUB17/SUB18/SUB19, between the first photoelectric element PE17/PE18/PE19 and the second photoelectric element PE27/PE28/PE29, and/or between the second photoelectric element PE27/PE28/PE29 and the third photoelectric element PE37/PE38/PE39. Also, in some cases, the gate electrode may be provided above the third photoelectric element PE37/PE38/PE39.

In addition, the photoelectric device of FIGS. 20 to 24 may be manufactured on the substrate SUB16 to SUB19 in a monolithic integration manner. Thus, the photoelectric devices of FIGS. 22 to 24 may be easily manufactured, for example, by using a silicon (Si)-based semiconductor device process. In this case, the above component layers may be deposited by using a physical vapor deposition (PVD) process, a chemical vapor deposition (CVD) process, an atomic layer deposition (ALD) process, any other deposition process, and/or any coating process.

In order to manufacture the photoelectric devices with various structures of FIGS. 20 to 24, a plurality of electrodes (e.g., E16, E26, E36, E46, E56, and E66 of FIGS. 20 and 21) may be efficiently disposed and the design thereof may be variously modified to easily form an interconnection structure connected thereto. This will be described below with reference to FIGS. 25 and 26.

Figure 25A:
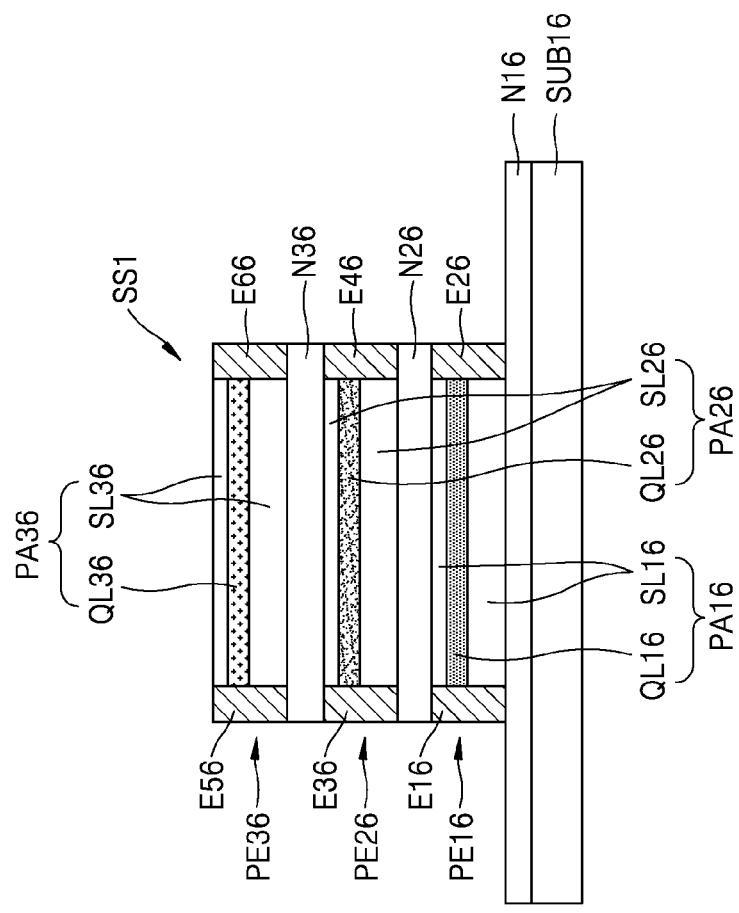
FIGS. 25A and 25B are diagrams illustrating a photoelectric device according to another exemplary embodiment.
Figure 25B:
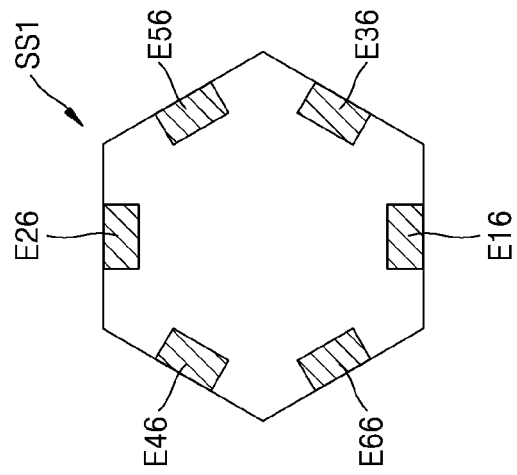

FIGS. 25A and 25B are diagrams illustrating a photoelectric device according to another exemplary embodiment. FIG. 25A is a cross-sectional view corresponding to FIG. 21, and FIG. 25B is a plan view illustrating an example of a possible planar structure of a stacked structure SS1 illustrated in FIG. 25A.

As illustrated in FIG. 25B, the stacked structure SS1 illustrated in FIG. 25A may have a hexagonal structure when viewed from above. The first to sixth electrodes E16, E26, E36, E46, E56, and E66 may be disposed at six side portions of the hexagonal structure of FIG. 25B. In this case, the first electrode E16 may be disposed to face the second electrode E26 paired therewith, the third electrode E36 may be disposed to face the fourth electrode E46 paired therewith, and the fifth electrode E56 may be disposed to face the sixth electrode E66 paired therewith. The first electrode E16, the third electrode E36, and the fifth electrode E56 may be source electrodes, and the second electrode E26, the fourth electrode E46, and the sixth electrode E66 may be drain electrodes. Since the electrodes E16, E26, E36, E46, E56, and E66 are provided at the respective side portions of the hexagonal structure, they may be disposed in such a way that they do not overlap each other as viewed from above. Thus, a layer stacking and integration process may be facilitated, and a field screening phenomenon possible between the electrodes may be suppressed or prevented.

FIG. 25A illustrates that the first, third, and fifth electrodes E16, E36, and E56 overlap each other and the second, fourth, and sixth electrodes E26, E46, and E66 overlap each other. However, this may be merely for convenience of description. Alternately, the arrangement of the electrodes E16, E26, E36, E46, E56, and E66 viewed from above may be the same as illustrated in FIG. 25B. This may also be the same in FIG. 26 that will be described below.

Figure 26A:
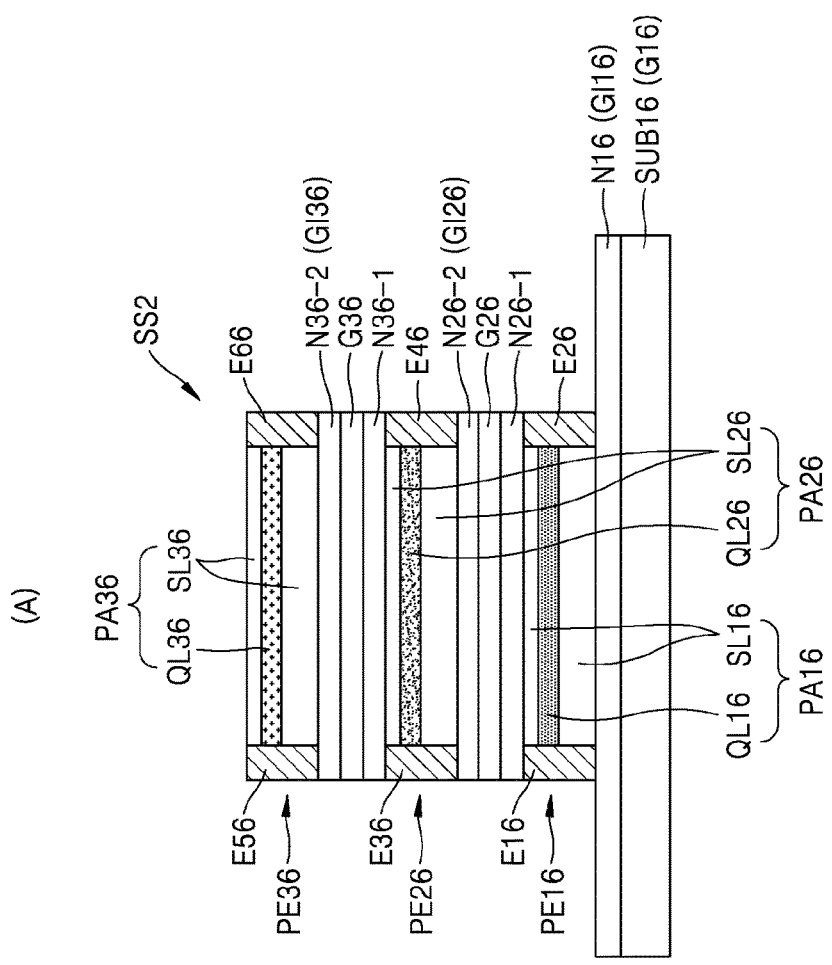
FIGS. 26A and 26B are diagrams illustrating a photoelectric device according to another exemplary embodiment; [need to revise]
Figure 26B:
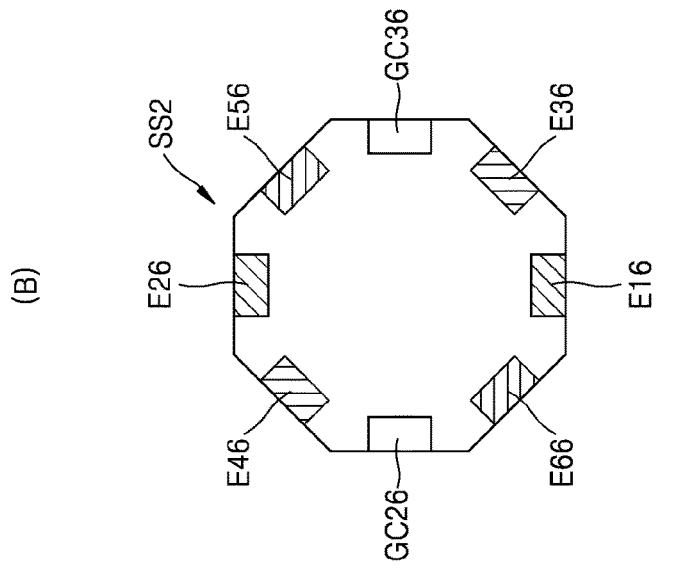

FIGS. 26A and 26B are diagrams illustrating a photoelectric device according to another exemplary embodiment. FIG. 26A is a cross-sectional view corresponding to FIG. 20, and FIG. 26B is a plan view illustrating an example of a possible planar structure of a stack structure SS2 illustrated in FIG. 26A.

As illustrated in FIG. 26B, the stacked structure SS2 illustrated in FIG. 26A may have an octagonal structure when viewed from above. The first to sixth electrodes E16, E26, E36, E46, E56, and E66 may be disposed at six side portions among eight side portions of the octagonal structure of FIG. 26B. The first electrode E16 may be disposed to face the second electrode E26, the third electrode E36 may be disposed to face the fourth electrode E46, and the fifth electrode E56 may be disposed to face the sixth electrode E66. Thus, the electrodes E16, E26, E36, E46, E56, and E66 may be disposed not to overlap each other as viewed from above.

In addition, two gate contact portions GC26 and GC36 facing each other may be provided at the other two side portions among the eight side portions of the octagonal structure of FIG. 26B. A second gate contact portion GC26 may be provided for electrical connection to a second gate electrode G26, and a third gate contact portion GC36 may be provided for electrical connection to a third gate electrode G36. Whether the second gate contact portion GC26 and the third gate contact portion GC36 are to be included may be determined according to whether the second gate electrode G26 and the third gate electrode G36 are included. Thus, at least one of the second gate contact portion GC26 and the third gate contact portion GC36 may be omitted. The second gate contact portion GC26 and the third gate contact portion GC36 may be formed to respectively contact two side portions of the octagonal structure, or may be formed in regions spaced apart from the two side portions, respectively.

Each of the hexagonal structure of FIG. 25B and the octagonal structure of FIG. 26B may be referred to as the possible shape of a pixel. The pixel shape and the electrode disposition described above are merely exemplary and may vary according to various exemplary embodiments. For example, the pixel may have various shapes such as a triangular shape, a tetragonal shape, and a pentagonal shape in addition to a hexagonal shape and an octagonal shape, and at least two of the electrodes may be disposed to overlap each other in the vertical direction. Also, at least some of the electrodes may be electrically connected to each other. For example, when the first electrode E16, the third electrode E36, and the fifth electrode E56 are used as source electrodes, they may be electrically connected to each other. In this case, the second electrode E26, the fourth electrode E46, and the sixth electrode E66 may be drain electrodes, and they may receive an applied electrical signal independently without being connected to each other.

Figure 27:
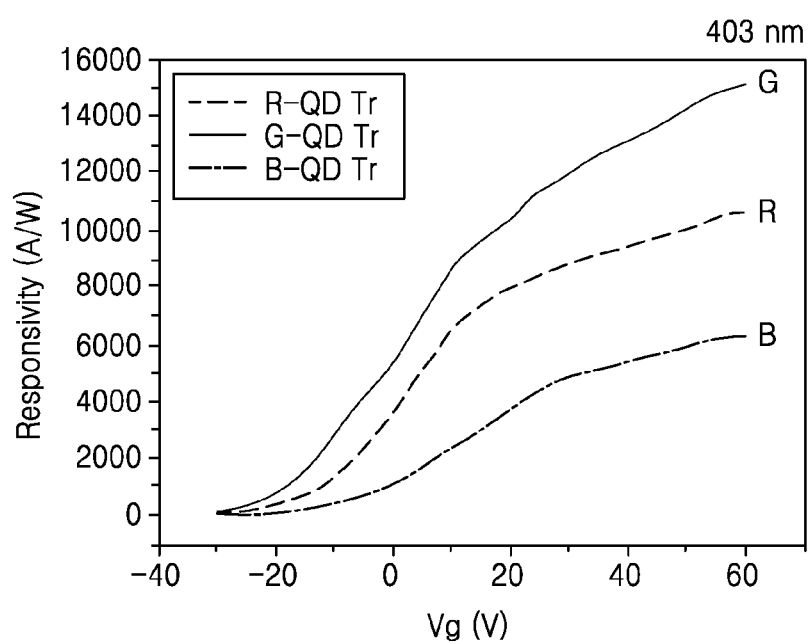
FIGS. 27 and 28 are graphs illustrating a change in a light responsivity with respect to a gate voltage Vg of a plurality of photoelectric conversion elements according to exemplary embodiments.
Figure 28:
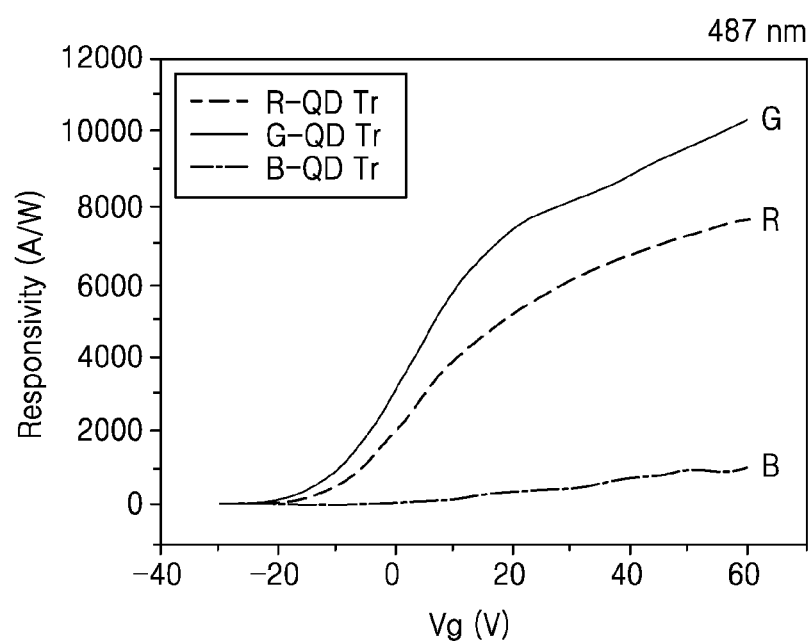

FIGS. 27 and 28 are graphs illustrating a change in a light responsivity with respect to the gate voltage Vg of a plurality of photoelectric conversion elements according to exemplary embodiments. FIG. 27 illustrates a measurement result based on light having a wavelength of about 403 nm, and FIG. 28 illustrates a measurement result based on light having a wavelength of about 487 nm. Both the measurement results of FIGS. 27 and 28 include the measurement results for the phototransistor R-QD Tr configured to absorb and thereby detect red (R) light, the phototransistor G-QD Tr configured to absorb and thereby detect green (G) light, and the phototransistor B-QD Tr configured to absorb and thereby detect blue (B) light.

Referring to FIG. 27, it may be seen that the responsivity of the photoelectric elements tends to increase as the gate voltage Vg increases. Depending on the gate voltage Vg, the responsivity of each of the red photoelectric element R-QD Tr, the green photoelectric element G-QD Tr, and the blue photoelectric element B-QD Tr may be so high as about 5000 A/W or more or about 10000 A/W or more. It may be seen that the responsivity of the green photoelectric element G-QD Tr is relatively high and the responsivity of the blue photoelectric element B-QD Tr is relatively low. Also, it may be seen that the responsivity of the red photoelectric element R-QD Tr is lower than the responsivity of the green photoelectric element G-QD Tr and is higher than the responsivity of the blue photoelectric element B-QD Tr.

Referring to FIG. 28, it may be seen that the responsivity of the blue photoelectric element B-QD Tr is reduced when the measurement is performed by using light having a wavelength of about 487 nm. Since the blue photoelectric element B-QD Tr hardly absorbs light having a wavelength of about 470 nm or more (see FIG. 14), it may hardly respond to light having a wavelength of about 487 nm, which is used in the present measurement. For this reason, the responsivity of the blue photoelectric element B-QD Tr may be low. It may be seen that the responsivity of the green photoelectric element G-QD Tr and the responsivity of the red photoelectric element R-QD Tr are very high while being lower than the corresponding values of FIG. 27.

Figure 29:
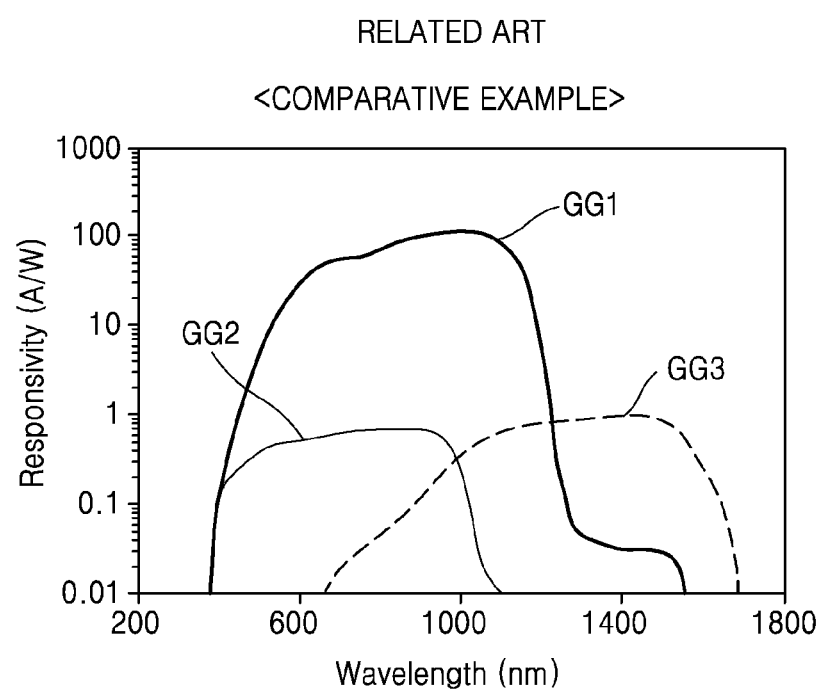
FIG. 29 is a graph illustrating a change in a light responsivity of photoelectric conversion elements according to a comparative example.

FIG. 29 is a graph illustrating a change in a light responsivity of photoelectric conversion elements according to a comparative example. A first graph GG1 of FIG. 29 illustrates the result of a silicon (Si)-based first photodetector, a second graph GG2 of FIG. 29 illustrates the result of an Si-based second photodetector, and a third graph GG3 of FIG. 29 illustrates the result of an InGaAs-based third photodetector.

Referring to FIG. 29, it may be seen that the Si-based photodetectors (the first and second photodetectors) and the InGaAs-based photodetector (the third photodetector) have a responsivity of about 1 A/W to about 100 A/W. This may be considerably low in comparison with the responsivity of the photoelectric conversion elements according to the exemplary embodiments described with reference to FIGS. 27 and 28. From this, according to the exemplary embodiments, it may be seen that the photoelectric conversion elements having a considerably higher responsivity than the existing photodetectors may be implemented.

Figure 30:
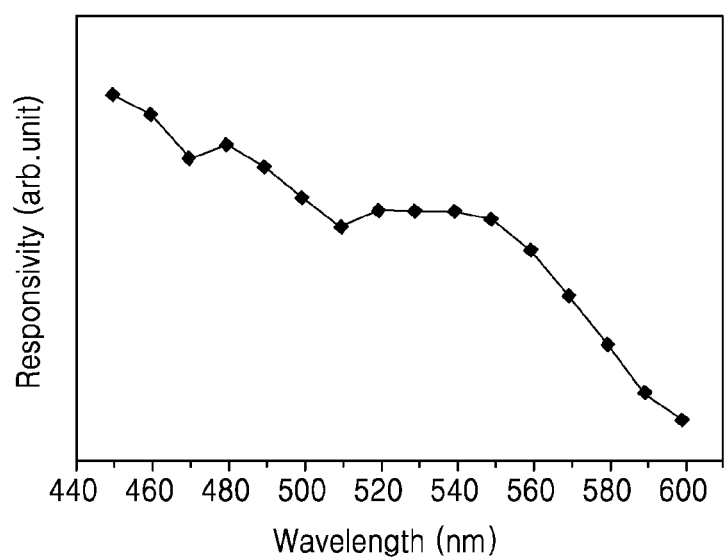
FIG. 30 is a graph illustrating a change in a light responsivity change with respect to a change in the wavelength of light incident on a photoelectric device (photoelectric element) according to an exemplary embodiment.

FIG. 30 is a graph illustrating a change in a light responsivity with respect to a change in a wavelength of light incident on a photoelectric element according to an exemplary embodiment. The photoelectric element of the present exemplary embodiment is a photoelectric element including a red (R) quantum dot layer. Herein, the red (R) quantum dot layer has a four-layer (4L) structure that is a structure in which a monolayer including quantum dots is stacked four times. Referring to FIG. 30, it may be seen that the responsivity tends to be considerably reduced in a wavelength range of more than about 570 nm.

Figure 31:
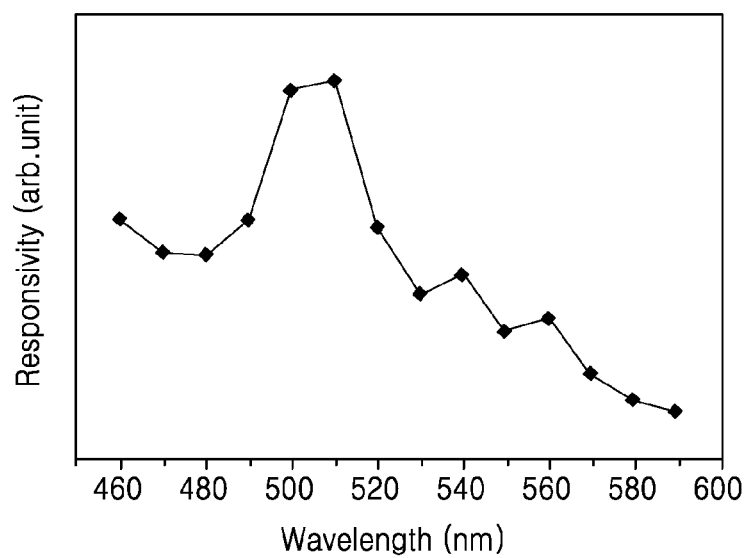
FIG. 31 is a graph illustrating a change in a light responsivity with respect to a change in the wavelength of light incident on a photoelectric device (photoelectric element) according to another exemplary embodiment.

FIG. 31 is a graph illustrating a change in a light responsivity with respect to a change in the wavelength of light incident on a photoelectric element according to another exemplary embodiment. The photoelectric element of the present exemplary embodiment is a photoelectric element including a green (G) quantum dot layer. Herein, the green (G) quantum dot layer has a six-layer (6L) structure. Referring to FIG. 31, it may be seen that the responsivity is relatively high at a wavelength of about 500 nm to about 520 nm and is reduced in a wavelength range larger than the wavelength.

Figure 32:
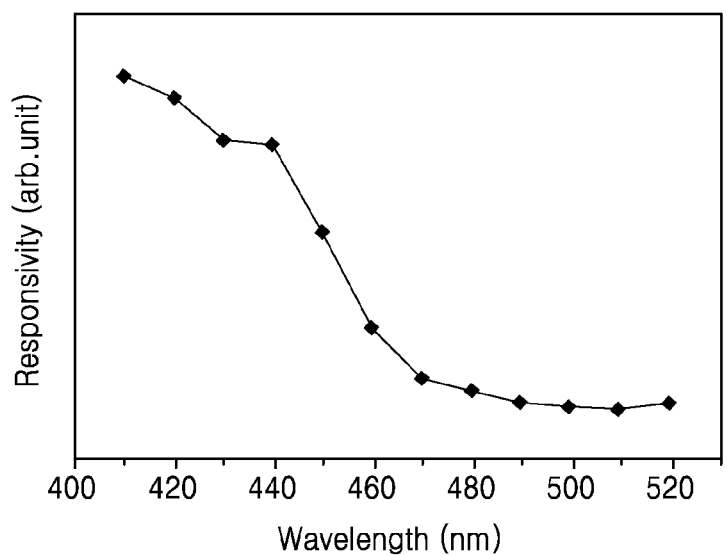
FIG. 32 is a graph illustrating a change in a light responsivity with respect to a change in the wavelength of light incident on a photoelectric device (photoelectric element) according to another exemplary embodiment.

FIG. 32 is a graph illustrating a change in a light responsivity with respect to a change in the wavelength of light incident on a photoelectric element according to another exemplary embodiment. The photoelectric element of the present exemplary embodiment is a photoelectric element including a blue (B) quantum dot layer. Herein, the blue (B) quantum dot layer has a six-layer (6L) structure. Referring to FIG. 32, it may be seen that the responsivity is relatively high at a wavelength of about 440 nm and is greatly reduced in a wavelength range larger than the wavelength.

The results of FIGS. 30 to 32 may correspond to the absorption spectrum data of FIG. 14. From the results of FIGS. 30 to 32 and FIG. 14, it may be seen that the quantum dot layer applicable to the photoelectric elements according to the exemplary embodiments may act as a kind of cutoff filter.

Figure 33:
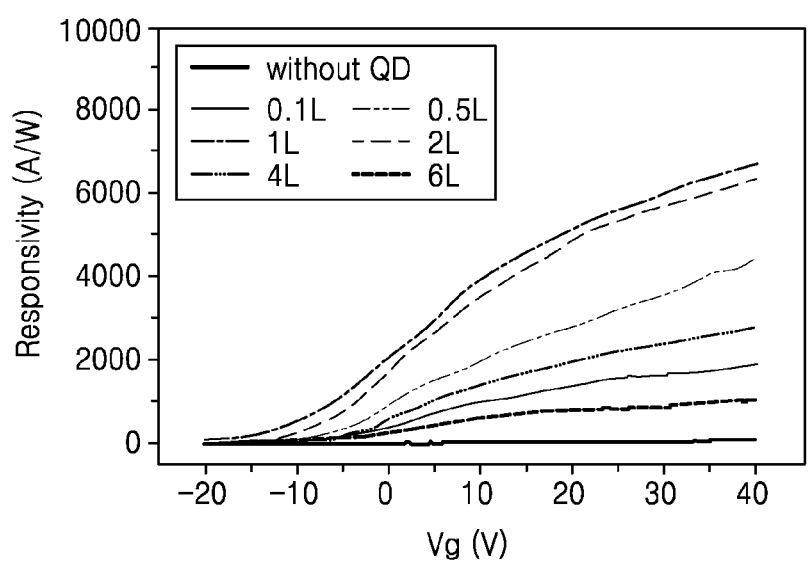
FIG. 33 is a graph illustrating a change in a light responsivity with respect to the thickness (the number of layers) of a quantum dot layer in a photoelectric device having a structure of FIG. 2.

FIG. 33 is a graph illustrating a change in a light responsivity with respect to the thickness (the number of layers) of a quantum dot layer in a photoelectric device having a structure of FIG. 2. In this case, a photoactive layer has a SIZO/QD(red)/SIZO structure. The responsivity is measured for thicknesses (numbers of layers) of a quantum dot (QD) layer of 0.1L, 0.5L, 1L, 2L, 4L, and 6L. Herein, 1L represents a case in which quantum dots constitute a monolayer, 2L represents a case in which quantum dots constitute a bilayer, and 4L/6L represents a case in which a monolayer constituted by quantum dots is stacked four/six times. Also, 0.5L represents a case in which a formation density of quantum dots in a monolayer decreases to about 50%, and 0.1L represents a case in which a formation density of quantum dots in a monolayer decreases to about 10%. For comparison, the responsivity in the case of not using a quantum dot (QD) layer (i.e., without QD) is measured. The light used for responsivity measurement has a wavelength of about 487 nm.

Referring to FIG. 33, it may be seen that the responsivity in the case of not using a quantum dot (QD) layer (i.e., without QD) is lowest as about 0 A/W and the responsivity in the case of using a quantum dot (QD) layer corresponding to 1L (i.e., a monolayer) is highest.

Figure 34:
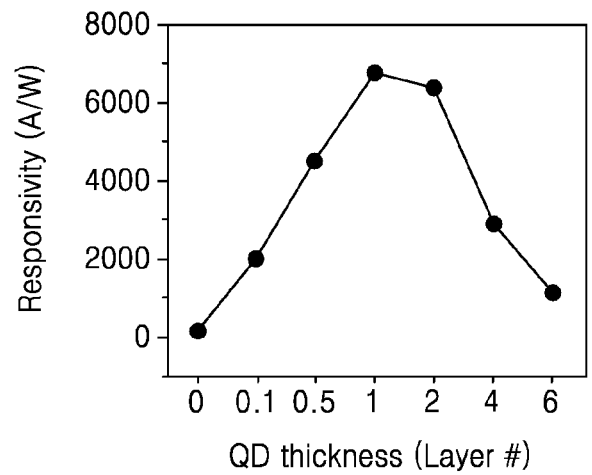
FIG. 34 is a graph illustrating a change in a light responsivity of a photoelectric device with respect to the thickness (the number of layers) of a quantum dot (QD) layer, which is obtained from data of FIG. 33.

FIG. 34 is a graph illustrating a change in a light responsivity with respect to the thickness (the number of layers) of a quantum dot (QD) layer, which is obtained from the data of FIG. 33. The results of FIG. 34 corresponds to the results of FIG. 33. Referring to FIG. 34, the responsivity in the case of using a quantum dot (QD) layer corresponding to 1L (i.e., a monolayer) may be highest, and the responsivity thereof may tend to decrease when the thickness (the number of layers) of a quantum dot (QD) layer increases or decreases. However, this is merely the result of a particular exemplary embodiment, and different results may occur in the photoelectric devices according to other exemplary embodiments.

Figure 35A:
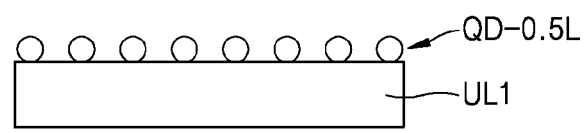
FIGS. 35A, 35B, and 35C are a cross-sectional views illustrating the concept of the thickness (the number of layers) of the quantum dot (QD) layer discussed with respect to FIGS. 33 and 34.
Figure 35B:
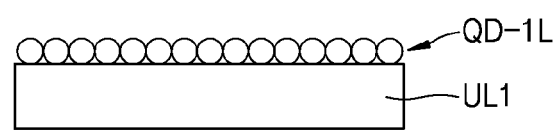
Figure 35C:
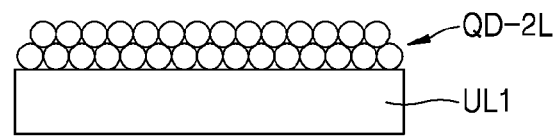

FIGS. 35A, 35B, and 35C are cross-sectional views illustrating the concept of the thickness (the number of layers) of the quantum dot (QD) layer discussed with respect to FIGS. 33 and 34. FIG. 35A illustrates a 0.5L quantum dot layer QD-0.5L, FIG. 35B illustrates a 1L quantum dot layer QD-1L, and FIG. 35C illustrates a 2L quantum dot layer QD-2L. In FIGS. 35A, 35B, and 35C, UL1 denotes an underlayer on which the quantum dot layer QD-0.5L, QD-1L, or QD-2L is formed. The underlayer UL1 may correspond, for example, to the lower semiconductor layer SL10a of FIG. 2.

Figure 36:
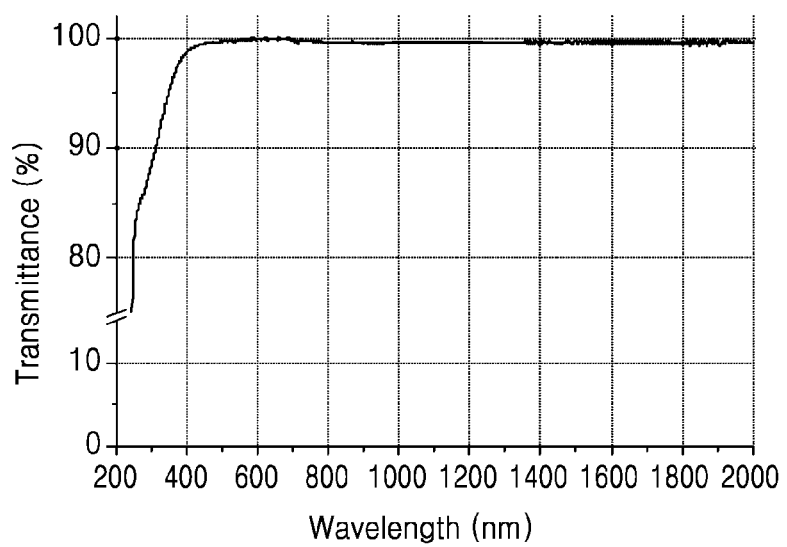
FIG. 36 is a graph illustrating a result of measuring the transmittance of an oxide semiconductor layer that may be applied to an electronic device according to an exemplary embodiment.

FIG. 36 is a graph illustrating a result of measuring the transmittance (%) of an oxide semiconductor layer that may be applied to an electronic device according to an exemplary embodiment. Herein, the oxide semiconductor layer to be measured is a SIZO layer and has a thickness of about 40 nm.

Referring to FIG. 36, it may be seen that the transmittance of the oxide semiconductor layer (SIZO layer) is as high as about 100% with respect to light having a wavelength of about 380 nm or more (i.e., visible light and light having higher wavelengths).

Figure 37:
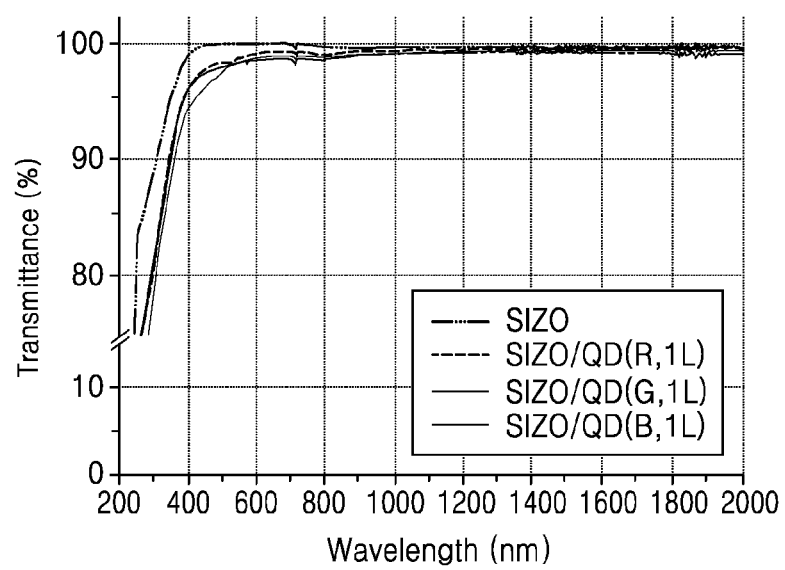
FIG. 37 is a graph illustrating a result of measuring the transmittance of a semiconductor layer/quantum dot layer structure that may be utilized in an electronic device according to another exemplary embodiment.

FIG. 37 is a graph illustrating a result of measuring the transmittance (%) of a semiconductor layer/quantum dot layer structure that may be utilized in an electronic device according to another exemplary embodiment. Herein, the semiconductor layer is a SIZO layer and has a thickness of about 40 nm. The quantum dot layer is a red (R), green (G), or blue (B) quantum dot layer having a monolayer structure. That is, the transmittance is measured about a SIZO/QD(R, 1L) structure, a SIZO/QD(G,1L) structure, and a SIZO/QD (B,1L) structure. Also, the result of FIG. 37 also includes the result of FIG. 36, that is, the transmittance measurement result about the SIZO layer having a thickness of about 40 nm.

Referring to FIG. 37, it may be seen that the transmittance of the semiconductor layer (SIZO layer)/quantum dot layer (QD layer) is as high as about 95% or more with respect to light having a wavelength of about 380 nm or more (i.e., visible light and light having higher wavelengths).

Figure 38:
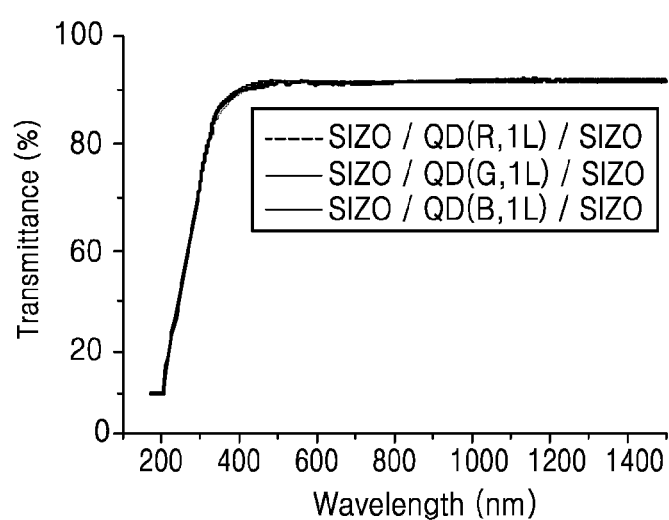
FIG. 38 is a graph illustrating a result of measuring the transmittance of a lower semiconductor layer/quantum dot layer/upper semiconductor layer structure that may be applied to an electronic device according to another exemplary embodiment.

FIG. 38 is a graph illustrating a result of measuring the transmittance (%) of a lower semiconductor layer/quantum dot layer/upper semiconductor layer structure that may be utilized in an electronic device according to another exemplary embodiment. Herein, the lower semiconductor layer is a SIZO layer having a thickness of about 40 nm, and the upper semiconductor layer is a SIZO layer having a thickness of about 20 nm. The quantum dot layer is a red (R), green (G), or blue (B) quantum dot layer having a monolayer structure. That is, the transmittance is measured about a SIZO(40 nm)/QD(R,1L)/SIZO(20 nm) structure, a SIZO(40 nm)/QD(G,1L)/SIZO(20 nm) structure, and a SIZO(40 nm)/QD(B,1L)/SIZO(20 nm) structure.

Referring to FIG. 38, it may be seen that the transmittance of the semiconductor layer (SIZO layer)/quantum dot layer (QD layer)/semiconductor layer (SIZO layer) is as high as about 90% or more with respect to light having a wavelength of about 380 nm or more (i.e., visible light and infrared light).

From the results of FIGS. 36 to 38, it may be seen that a photoactive layer formed by using the semiconductor layer/quantum dot layer structure or the semiconductor layer/quantum dot layer structure/semiconductor layer structure may have a very high transmittance. Thus, even when the photoelectric devices illustrated in FIGS. 20 to 26 are manufactured by stacking a plurality of photoelectric elements (e.g., R/G/B photoelectric elements) including the photoactive layer, separate light absorption and detection may be easily performed with little light blocking or interference therebetween. Also, each photoelectric element may be utilized in a transparent device, and a photoelectric device including a plurality of photoelectric elements may also be utilized in a transparent device.

Figure 39:
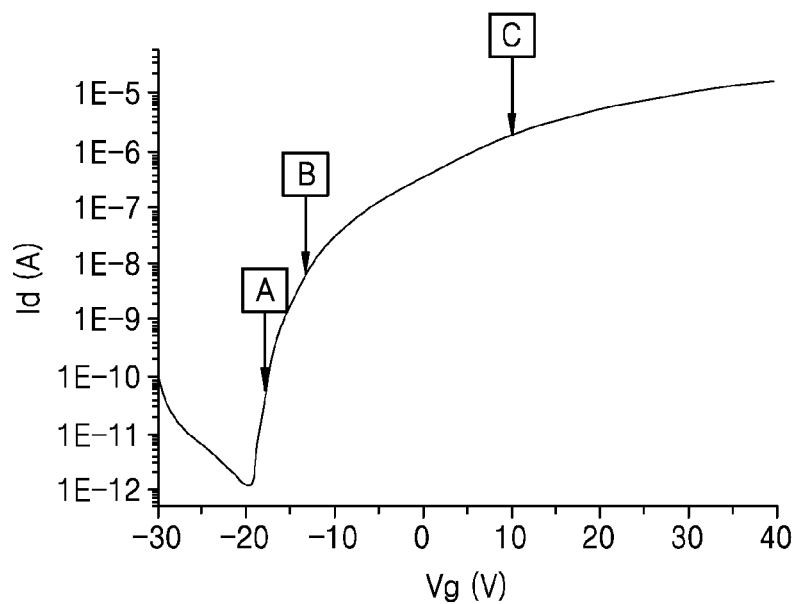
FIG. 39 is a graph illustrating a gate voltage Vg-drain current Id transfer curve of a device including a green (G) quantum dot layer according to an exemplary embodiment.

FIG. 39 is a graph illustrating a gate voltage Vg-drain current Id transfer curve of a device including a green (G) quantum dot layer according to an exemplary embodiment. Herein, points A, B, and C of FIG. 39 are points with a gate voltage Vg of about −17 V, about −12 V, and about 10 V, respectively, and the Id levels thereof are about 50 pA, about 6 nA, and about 2 μA, respectively.

Figure 40:
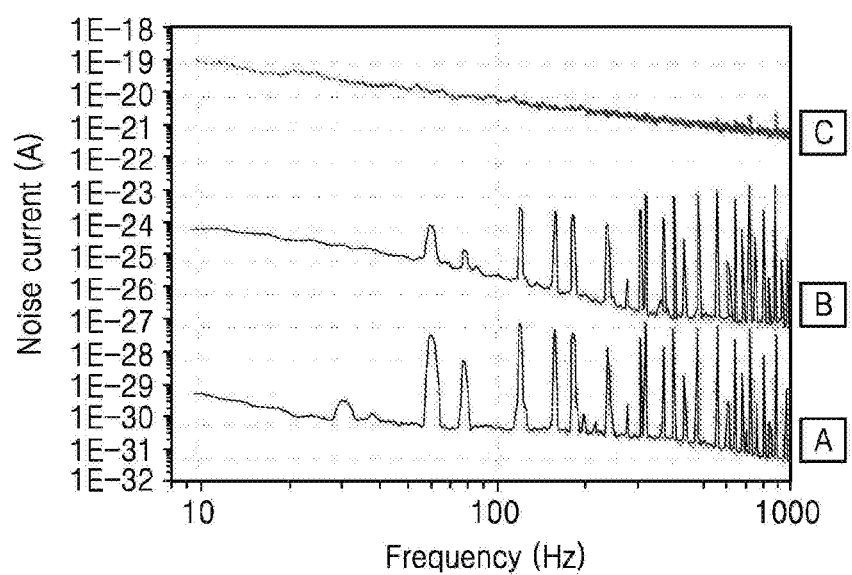
FIG. 40 is a graph illustrating a result of measuring a noise current when the Vg of the device of FIG. 39 is about −17 V, about −12 V, and about 10 V.

FIG. 40 is a graph illustrating a result of measuring a noise current when the Vg of the device of FIG. 39 is about −17 V, about −12 V, and about 10 V. A, B, and C of FIG. 40 are respectively graphs corresponding to the points A, B, and C of FIG. 39. In the measurement of FIG. 40, a source-drain voltage "Vsd" is about 5V. The noise level is measured in a frequency range of about 10 Hz to about 1000 Hz. It may be seen that the noise current level increases as the Id level increases (i.e., A→B→C). In the present graph, sharp peaks of A and B are 60 Hz noises that occur when the noise level generally decreases. The fact that the noise increases as the current level (i.e., the Id level) of the device increases may be related to the fact that the shot noise corresponding to the theoretical minimum value of the device noise increases as the current level increases.

Figure 41:
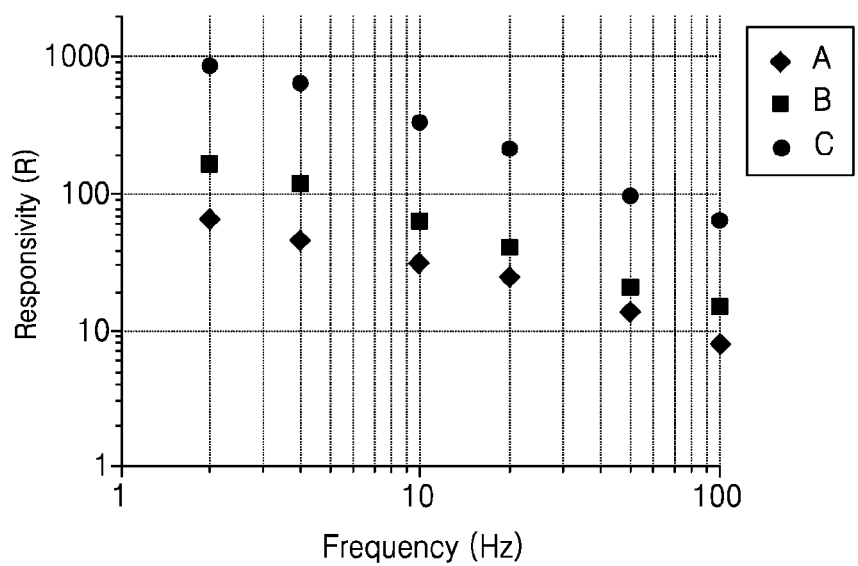
FIG. 41 is a graph illustrating a frequency-dependent change in a light responsivity when the Vg of the device of FIG. 39 is about −17 V, about −12 V, and about 10 V.

FIG. 41 is a graph illustrating a frequency-dependent change in a light responsivity when the Vg of the device of FIG. 39 is about −17 V, about −12 V, and about 10 V. In this case, the Vsd is about 5 V as in the noise measurement. The responsivity depending on an input frequency is measured in a period of about 2 Hz to about 100 Hz while giving an optical input by a 403 nm laser.

Figure 42:
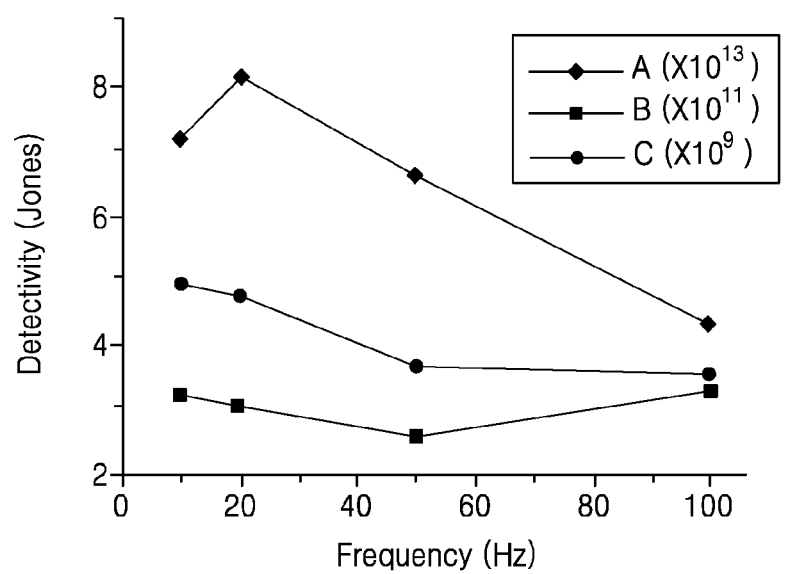
FIG. 42 is a graph illustrating the detectivity of a device calculated from the noise value of FIG. 40 and the responsivity value of FIG. 41.

FIG. 42 is a graph illustrating the detectivity of a device calculated from the noise value of FIG. 40 and the responsivity value of FIG. 41. The maximum detectivity value of the device measured in the present exemplary embodiment is about $8.1 \times 10^{13}$ Jones at about 20 Hz when Vg=−17 V, Vsd=5 V. This value is higher by about 16% than $7.0 \times 10^{13}$ Jones that is the maximum detectivity value known in a QD photodetection system. Also, the value is about 4 or more times higher than the detectivity value of a commercialized silicon photodiode that is generally used in various photodetection devices.

The photoelectric devices according to various exemplary embodiments may have excellent performances. For example, the photoelectric devices according to the exemplary embodiments may have a high responsivity, high detectivity, and low noise-equivalent power (NEP) value. More particularly, a photoelectric device including a quantum dot corresponding to a red (R) light may have a responsivity of about 5000 A/W to about 10000 A/W, a photoelectric device including a quantum dot corresponding to a green (G) light may have a responsivity of about 10000 A/W to about 15000 A/W, a photoelectric device including a quantum dot corresponding to a blue (B) light may have a responsivity of about 2000 A/W to about 6000 A/W, and a photoelectric device including a quantum dot corresponding to an infrared (IR) light may have a responsivity of about 5000 A/W or more. Herein, the term infrared (IR) light may be used to refer to near-infrared (NIR) light. Also, the photoelectric devices according to the exemplary embodiments may have a high detectivity of about $8 \times 10^{13}$ Jones and a low NEP value of about $1 \times 10^{-15}$ Watt. Considering that a related art Si photodetector has a responsivity of about 1 A/W to about 100 A/W, a detectivity of about $2 \times 10^{13}$ Jones, and a NEP value of about $2 \times 10^{-11}$ Watt, the photoelectric devices according to the exemplary embodiments may have relatively excellent performances. However, the above responsivity, detectivity, and NEP value ranges are merely exemplary and may vary according to the structures of devices and the materials/configurations of the semiconductor layers and the quantum dot layers.

Figures 43A, 43B:
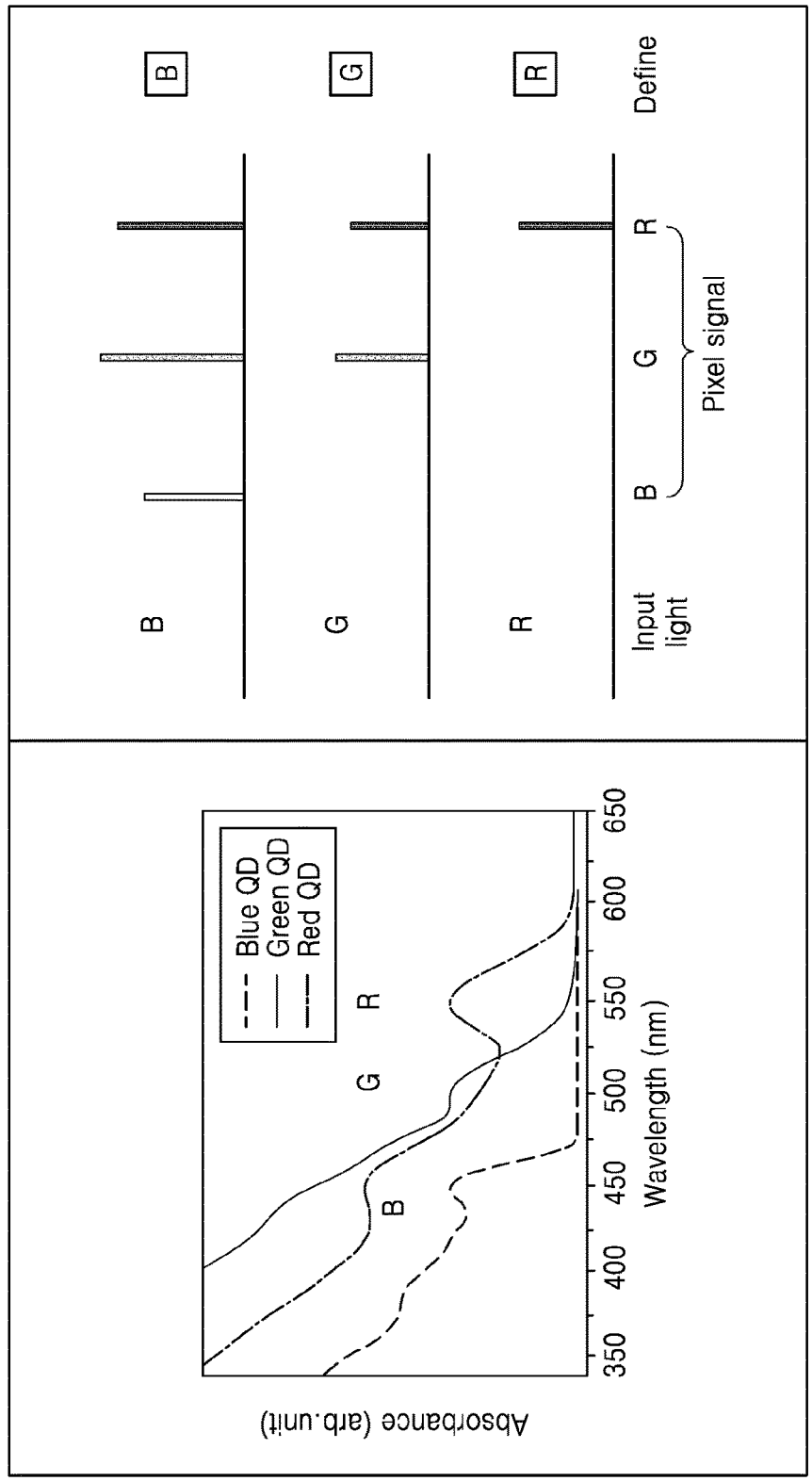
FIGS. 43A and 43B are diagrams illustrating an example of an algorithm for performing photodetection by using a photoelectric device including a plurality of photoelectric conversion elements (photoelectric elements) according to an exemplary embodiment.

FIGS. 43A and 43B are diagrams illustrating an example of an algorithm for performing photodetection by using a photoelectric device including a plurality of photoelectric conversion elements according to an exemplary embodiment. FIG. 43A is the same graph as the absorption spectrum of FIG. 14, and FIG. 43B is a diagram illustrating an example of the algorithm. FIG. 43A is a reference diagram for describing FIG. 43B.

Referring to FIGS. 43A and 43B, a plurality of photoelectric elements may include a photoelectric element for absorbing and thereby detecting red (R) light (hereinafter referred to as "R photoelectric element"), a photoelectric element for absorbing and thereby detecting green (G) light (hereinafter referred to as "G photoelectric element"), and a photoelectric element for absorbing and thereby detecting blue (B) light (hereinafter referred to as "B photoelectric element"). Red (R), green (G), and blue (B) light may be irradiated onto the photoelectric elements. Since the red (R) light may be absorbed only by the R photoelectric element, it may induce only a signal (R signal) caused by the R photoelectric element. Since the green (G) light may be absorbed by the G photoelectric element and the R photoelectric element, it may induce a signal (G signal) caused by the G photoelectric element and an R signal caused by the R photoelectric element. Since the blue (B) light may be absorbed by the B photoelectric element, the G photoelectric element, and the R photoelectric element, it may induce a signal (B signal) caused by the B photoelectric element, a G signal caused by the G photoelectric element, and an R signal caused by the R photoelectric element. Thus, when the R signal caused by the R photoelectric element is detected only, the irradiated light may be considered as the red (R) light. When the G signal caused by the G photoelectric element and the R signal caused by the R photoelectric element are detected and the B signal caused by the B photoelectric element is not detected, the irradiated light may be considered as the green (G) light. Also, when all of the B signal caused by the B photoelectric element, the G signal caused by the G photoelectric element, and the R signal caused by the R photoelectric element are detected, the irradiated light may be considered as the blue (B) light. In this manner, the wavelengths of irradiated light may be distinguished by using a simple algorithm. Also, various detection algorithms may be created by using a response signal ratio and/or information about whether the R, G, and B photoelectric elements) respond thereto. Thus, a white color light, a multi-color light, or the like may be detected and identified.

Although FIGS. 20 to 26 mainly illustrate the photoelectric devices including three photoelectric conversion elements, the exemplary embodiments are not limited thereto and may be variously modified. For example, a photoelectric device including two photoelectric conversion elements and a photoelectric device including four or more photoelectric conversion elements may be implemented according to various exemplary embodiments. Modification examples thereof will be described in brief with reference to FIGS. 44 and 45.

Figure 44:
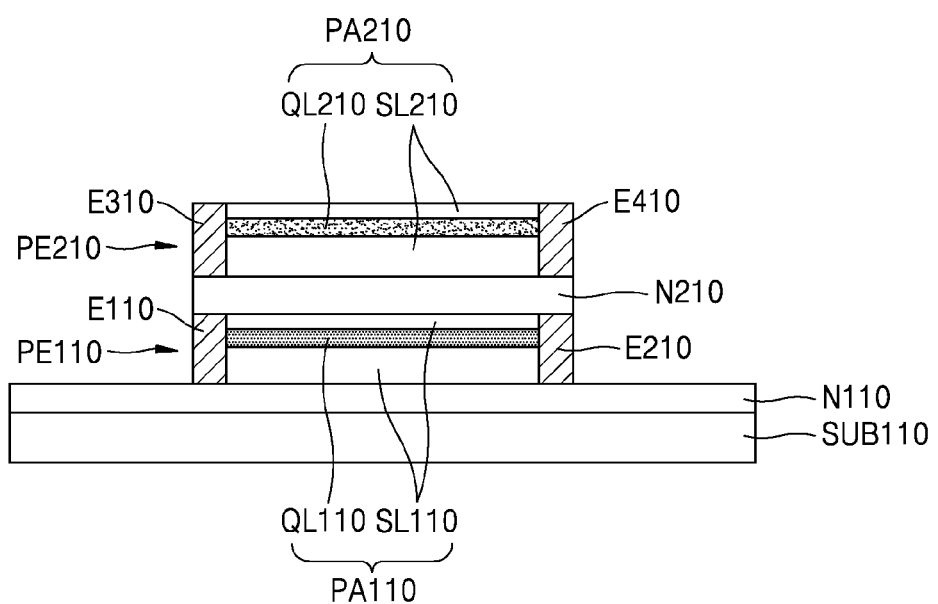
FIG. 44 is a cross-sectional view illustrating a photoelectric device according to another exemplary embodiment.

FIG. 44 is a cross-sectional view illustrating a photoelectric device according to another exemplary embodiment.

Referring to FIG. 44, first and second photoelectric conversion elements (hereinafter referred to as photoelectric elements) PE110 and PE210 may be provided on a substrate SUB110. The first and second photoelectric elements PE110 and PE210 may be configured to absorb and thereby detect light of different wavelength bands. A first insulating layer N110 may be provided on the substrate SUB110, and the first photoelectric element PE110 may be provided on the first insulating layer N110. The second photoelectric element PE210 may be provided on the first photoelectric element PE110. A second insulating layer N210 may be provided between the first photoelectric element PE110 and the second photoelectric element PE210.

The first photoelectric element PE110 may include a first photoactive layer PA110, and the first photoactive layer PA110 may include a first quantum dot layer QL110 and a first semiconductor layer SL110. The first quantum dot layer QL110 may be embedded in the first semiconductor layer SL110. The first photoelectric element PE110 may include a first electrode E110 and a second electrode E210 that respectively contact different regions of the first photoactive layer PA110. The second photoelectric element PE210 may include a second photoactive layer PA210, and the second photoactive layer PA210 may include a second quantum dot layer QL210 and a second semiconductor layer SL210. The second quantum dot layer QL210 may be embedded in the second semiconductor layer SL210. The second photoelectric element PE210 may include a third electrode E310 and a fourth electrode E410 that respectively contact different regions of the second photoactive layer PA210.

At least a portion of substrate SUB18 may be used as a gate electrode; and in this case, the first insulating layer N110 may be used as a gate insulating layer. Also, in some cases, a gate electrode may be provided between the first photoelectric element PE110 and the second photoelectric element PE210 and/or above the second photoelectric element PE210.

Figure 45:
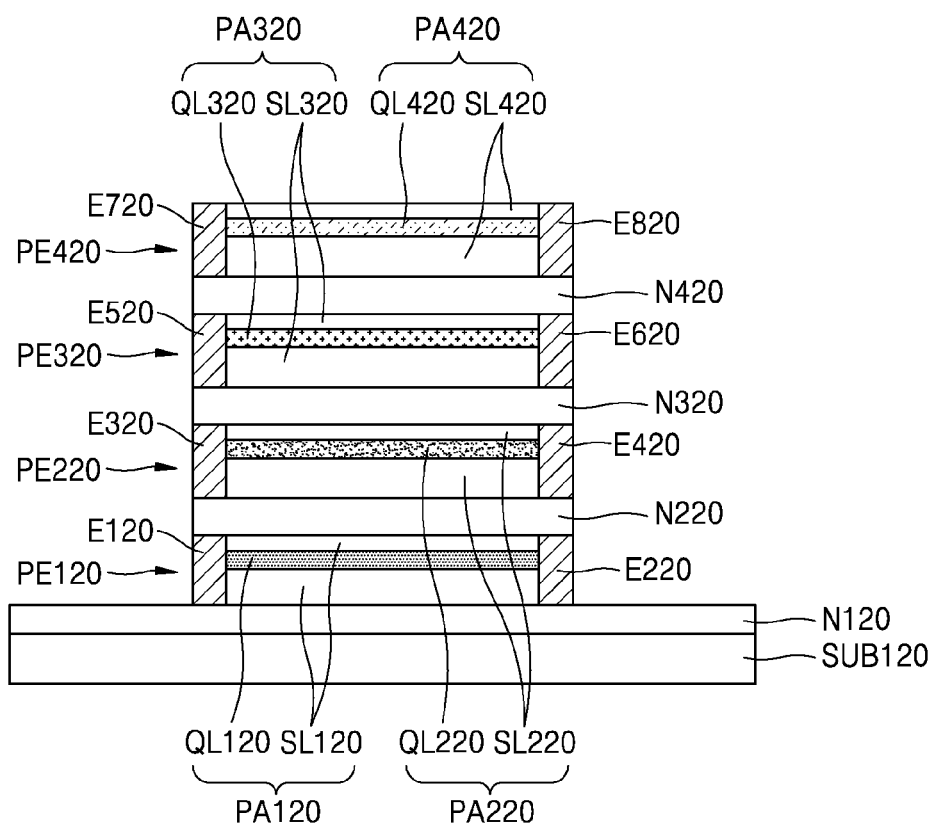
FIG. 45 is a cross-sectional view illustrating a photoelectric device according to another exemplary embodiment.

FIG. 45 is a cross-sectional view illustrating a photoelectric device according to another exemplary embodiment.

Referring to FIG. 45, first to fourth photoelectric conversion elements (hereinafter referred to as photoelectric elements) PE120, PE220, PE320, and PE420 may be provided on a substrate SUB120. The first to fourth photoelectric elements PE120, PE220, PE320, and PE420 may be sequentially stacked on one side of the substrate SUB120. A first insulating layer N120 may be provided between the substrate SUB120 and the first photoelectric element PE120, a second insulating layer N220 may be provided between the first photoelectric element PE120 and the second photoelectric element PE220, a third insulating layer N320 may be provided between the second photoelectric element PE220 and the third photoelectric element PE320, and a fourth insulating layer N420 may be provided between the third photoelectric element PE320 and the fourth photoelectric element PE420.

The first photoelectric element PE120 may include a first photoactive layer PA120, and the first photoactive layer PA120 may include a first quantum dot layer QL120 and a first semiconductor layer SL120. The first quantum dot layer QL120 may be embedded in the first semiconductor layer SL120. The first photoelectric element PE120 may include a first electrode E120 and a second electrode E220 that contact the first photoactive layer PA120. The second photoelectric element PE220 may include a second photoactive layer PA220, and the second photoactive layer PA220 may include a second quantum dot layer QL220 and a second semiconductor layer SL220. The second quantum dot layer QL220 may be embedded in the second semiconductor layer SL220. The second photoelectric element PE220 may include a third electrode E320 and a fourth electrode E420 that contact the second photoactive layer PA220. The third photoelectric element PE320 may include a third photoactive layer PA320, and the third photoactive layer PA320 may include a third quantum dot layer QL320 and a third semiconductor layer SL320. The third quantum dot layer QL320 may be embedded in the third semiconductor layer SL320. The third photoelectric element PE320 may include a fifth electrode E520 and a sixth electrode E620 that contact the third photoactive layer PA320. The fourth photoelectric element PE420 may include a fourth photoactive layer PA420, and the fourth photoactive layer PA420 may include a fourth quantum dot layer QL420 and a fourth semiconductor layer SL420. The fourth quantum dot layer QL420 may be embedded in the fourth semiconductor layer SL420. The fourth photoelectric element PE420 may include a seventh electrode E720 and a eighth electrode E820 that contact the fourth photoactive layer PA420.

The first photoelectric element PE120 may be configured to absorb and thereby detect a light corresponding to any one of red (R), green (G), blue (B), and infrared (IR) light, the second photoelectric element PE220 may be configured to absorb and thereby a light corresponding to another one of the R, G, B, and IR light, the third photoelectric element PE320 may be configured to absorb and thereby detect light corresponding to another one of the R, G, B, and IR light, and the fourth photoelectric element PE420 may be configured to absorb and thereby detect light corresponding to the other one of the R, G, B, and IR light. However, this is merely exemplary; and the wavelength bands of the light absorbed and thereby detected by the respective photoelectric elements PE120, PE220, PE320, and PE420 and/or the disposition order of the photoelectric elements PE120, PE220, PE320, and PE420 may vary according to various exemplary embodiments.

At least one gate electrode may be further provided to apply an electric field to the first to fourth photoelectric elements PE120, PE220, PE320, and PE420. The least one gate electrode may be provided at least one of below the first photoelectric element PE120, for example, in the substrate SUB120; between the first photoelectric element PE120 and the second photoelectric element PE220; between the second photoelectric element PE220 and the third photoelectric element PE320; and between the third photoelectric element PE320 and the fourth photoelectric element PE420. Also, a gate electrode may be provided above the fourth photoelectric element PE420. Also, in some cases, at least one additional photoelectric conversion element may be further stacked above the fourth photoelectric element PE420.

In addition, the photoelectric devices according to various exemplary embodiments described with reference to FIGS. 20 to 26, 44, 45, and so on may be modified in various manners as described with reference to FIGS. 1, 2, 7, 8, 9, for example.

The photoelectric devices according to various exemplary embodiments described above may be applied for various purposes to various electronic apparatuses. For example, the photoelectric devices according to the exemplary embodiments may be implemented in the form of various sensors such as image sensors and photosensors to be utilized in various electronic apparatuses such as mobile phone cameras and digital cameras. Herein, the image sensors may include, for example, complementary metal-oxide semiconductor (CMOS) image sensors. Also, photoelectric devices according to the exemplary embodiments may be utilized in photovoltaic devices such as solar cells, or various similar energy devices. Also, photoelectric devices according to the exemplary embodiments may be utilized in various photosensors such as compact multi-band sensors, medical photosensors, and universal photosensors such as high-integration and high-performance photosensors. Also, the photoelectric devices according to exemplary embodiments may be utilized in various display apparatuses. The configuration of a photoelectric device may vary according to the application fields thereof. For example, when a photoelectric device according to an exemplary embodiment is utilized in a photodetection device, the quantum dot layer may include a number of about 0.1 layer to about 20 layers; and when a photoelectric device according to an exemplary embodiment is utilized in a photovoltaic device, the quantum dot layer may include a number of about 3 layers to about 1000 layers. Also, at least one gate electrode may or may not be used according to circumstances. In addition, the photoelectric devices according to various exemplary embodiments may be utilized in transparent devices and/or flexible devices. In the case of a flexible device, it may be manufactured on a polymer or plastic substrate. However, the application fields presented herein are merely exemplary, and photoelectric devices according to exemplary embodiments may also be utilized in any other fields that may use devices for converting optical energy into electrical energy.

In addition, although the above various exemplary embodiments mainly illustrate and describe cases in which a photoelectric device is implemented by using a quantum dot layer and a semiconductor layer contacting the quantum dot layer, the quantum dot layer may be replaced with a different material layer. For example, after a nanostructure layer is formed by using nanoparticles, nanowires, or nanotubes instead of quantum dots, the nanostructure layer may be applied instead of the quantum dot layer. Herein, the nanoparticles, nanowires, and nanotubes may be formed of a semiconductor or a conductor (e.g., a metal). Also, the semiconductor layer may include a non-oxide semiconductor, that is, a semiconductor that is not an oxide semiconductor. Also, the semiconductor layer may include both an oxide semiconductor and a non-oxide semiconductor. For example, a non-oxide semiconductor may include a III-V group-based semiconductor such as GaN. In addition, the materials and structures thereof may vary in various ways.

Although many details have been described above, they are not intended to limit the scope of the inventive concept, but should be interpreted as exemplary aspects of exemplary embodiments. For example, those of ordinary skill in the art will understand that the device structures of FIGS. 1 to 3, 7 to 9, 12, 13, 20 to 26, 44, and 45 may be variously modified. For example, those of ordinary skill in the art will understand that the shapes and formation positions of the electrodes (e.g., E1 and E2 of FIG. 1 and E10 and E20 of FIG. 2) may be variously modified and the materials and configurations of the quantum dot layers (e.g., QL1 of FIG. 1 and QL10 of FIG. 2) and the semiconductor layers (e.g., SL1 of FIG. 1 and SL10 of FIG. 2) may be variously modified. In addition, those of ordinary skill in the art will understand that the photoelectric elements according to exemplary embodiments may be used for various purposes in various electronic apparatuses. Therefore, the scope of the inventive concept should be defined not by the described exemplary embodiments but by the technical spirit and scope described in the following claims.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A photoelectric device for converting optical energy into electrical energy, the photoelectric device comprising:
    a photoactive layer comprising:
        a quantum dot layer configured to generate an electric charge in response to light incident thereon, and
        a semiconductor layer configured to conduct the electric charge generated by the quantum dot layer;
    a first electrode electrically connected to a first end of the semiconductor layer; and
    a second electrode electrically connected to a second end of the semiconductor layer,
    wherein the semiconductor layer comprises a lower semiconductor layer and an upper semiconductor layer, and the quantum dot layer is disposed between the lower semiconductor layer and the upper semiconductor layer, and
    wherein a thickness of the lower semiconductor layer is different from a thickness of the upper semiconductor layer.

2. The photoelectric device of claim 1, wherein the semiconductor layer has an energy band gap of about 3.0 eV to about 5.0 eV.

3. The photoelectric device of claim 1, wherein the quantum dot layer comprises a plurality of quantum dots, wherein each of the plurality of quantum dots comprises at least one of a II-VI group-based semiconductor, a III-V group-based semiconductor, a IV-VI group-based semiconductor, a IV group-based semiconductor, and a graphene quantum dot.

4. The photoelectric device of claim 1, wherein the first electrode is spaced apart from the second electrode in a direction parallel to the photoactive layer.

5. The photoelectric device of claim 1, wherein
the photoelectric device is a phototransistor, and
the photoelectric device further comprises a gate electrode configured to apply an electric field to the photoactive layer.

6. The photoelectric device of claim 1, wherein the photoelectric device is one of a photodetector and a photovoltaic device.

7. An electronic apparatus comprising the photoelectric device of claim 1.

8. The photoelectric device of claim 1, wherein the semiconductor layer comprises an oxide semiconductor.

9. The photoelectric device of claim 8, wherein the oxide semiconductor comprises at least one of a zinc oxide (ZnO)-based oxide, an indium oxide (InO)-based oxide, and a tin oxide (SnO)-based oxide.

10. The photoelectric device of claim 8, wherein the oxide semiconductor comprises at least one of a silicon indium zinc oxide (SIZO), a silicon zinc tin oxide (SZTO), a zinc oxide (ZnO), an indium zinc oxide (IZO), a zinc tin oxide (ZTO), a gallium indium zinc oxide (GIZO), a hafnium indium zinc oxide (HIZO), an indium zinc tin oxide (IZTO), a tin oxide (SnO), an indium tin oxide (ITO), an indium gallium oxide (IGO), an indium oxide (InO), and an aluminum indium oxide (AIO).

11. A photoelectric device comprising:
a plurality of photoelectric conversion elements, each configured to convert optical energy into electrical energy, wherein
the plurality of photoelectric conversion elements comprise a first photoelectric conversion element and a second photoelectric conversion element,
wherein the first photoelectric conversion element comprises:
a first electrode, a second electrode, and a first photoactive layer disposed between the first electrode and the second electrode, wherein the first photoactive layer comprises a first quantum dot layer configured to generate an electric charge in response to light incident thereon, and a first semiconductor layer configured to conduct the electric charge generated by the first quantum dot layer; and
wherein the second photoelectric conversion element comprises:
a third electrode, a fourth electrode, and a second photoactive layer disposed between the third electrode and the fourth electrode, wherein the second photoactive layer comprises a second quantum dot layer configured to generate an electric charge in response to light incident thereon, and a second semiconductor layer configured to conduct the electric charge generated by the second quantum dot layer,
wherein the first quantum dot layer is configured to absorb light in a first wavelength band and the second quantum dot layer is configured to absorb light in a second wavelength band, different from the first wavelength band.

12. The photoelectric device of claim 11, wherein the plurality of photoelectric conversion elements are spaced apart from each other in a horizontal direction.

13. The photoelectric device of claim 11, wherein the plurality of photoelectric conversion elements are stacked in a vertical direction.

14. The photoelectric device of claim 11, wherein at least one of the first semiconductor layer and the second semiconductor layer has an energy band gap of about 3.0 eV to about 5.0 eV.

15. The photoelectric device of claim 11, wherein the first quantum dot layer is embedded in the first semiconductor layer, and/or the second quantum dot layer is embedded in the second semiconductor layer.

16. The photoelectric device of claim 11, further comprising at least one gate electrode configured to apply an electric field to the plurality of photoelectric conversion elements.

17. An electronic apparatus comprising the photoelectric device of claim 11.

18. The photoelectric device of claim 11, wherein
the plurality of photoelectric conversion elements further comprises a third photoelectric conversion element,
wherein the third photoelectric conversion element comprises:
a fifth electrode, a sixth electrode, and a third photoactive layer disposed between the fifth electrode and the sixth electrode, wherein the third photoactive layer comprises a third quantum dot layer configured to generate an electric charge in response to light incident thereon, and a third semiconductor layer configured to conduct the electric charge generated by the third quantum dot layer, and
wherein the third quantum dot layer is configured to absorb light in a third wavelength band different from the first wavelength band and the second wavelength band.

19. The photoelectric device of claim 18, wherein
the first photoelectric conversion element is configured to absorb light corresponding to one of red light, green light, blue light, and infrared light,
the second photoelectric conversion element is configured to absorb light corresponding to one of red light, green light, blue light, and infrared light, and
the third photoelectric conversion element is configured to absorb light corresponding to one of red light, green light, blue light, and infrared light.

20. The photoelectric device of claim 11, wherein at least one of the first semiconductor layer and the second semiconductor layer comprises an oxide semiconductor.

21. The photoelectric device of claim 20, wherein the oxide semiconductor comprises at least one of a zinc oxide (ZnO)-based oxide, an indium oxide (InO)-based oxide, and a tin oxide (SnO)-based oxide.

22. The photoelectric device of claim 20 wherein the oxide semiconductor comprises at least one of a silicon indium zinc oxide (SIZO), a silicon zinc tin oxide (SZTO), a zinc oxide (ZnO), an indium zinc oxide (IZO), a zinc tin oxide (ZTO), a gallium indium zinc oxide (GIZO), a hafnium indium zinc oxide (HIZO), an indium zinc tin oxide (IZTO), a tin oxide (SnO), an indium tin oxide (ITO), an indium gallium oxide (IGO), an indium oxide (InO), and an aluminum indium oxide (AIO).

23. A photoelectric device comprising:
a plurality of photoelectric conversion elements, each configured to convert optical energy into electrical energy, wherein
the plurality of photoelectric conversion elements comprise a first photoelectric conversion element, a second photoelectric conversion element, and a third photoelectric conversion element, wherein the first photoelectric conversion element comprises:
  a first electrode, a second electrode, and a first photoactive layer disposed between the first electrode and the second electrode, wherein the first photoactive layer comprises a first quantum dot layer configured to generate an electric charge in response to light incident thereon, and a first semiconductor layer configured to conduct the electric charge generated by the first quantum dot layer,
wherein the second photoelectric conversion element comprises:
  a third electrode, a fourth electrode, and a second photoactive layer disposed between the third electrode and the fourth electrode, wherein the second photoactive layer comprises a second quantum dot layer configured to generate an electric charge in response to light incident thereon, and a second semiconductor layer configured to conduct the electric charge generated by the second quantum dot layer, and wherein the third photoelectric conversion element comprises:
  a fifth electrode, a sixth electrode, and a third photoactive layer disposed between the fifth electrode and the sixth electrode, wherein the third photoactive layer comprises a third quantum dot layer configured to generate an electric charge in response to light incident thereon, and a third semiconductor layer configured to conduct the electric charge generated by the third quantum dot layer, and
wherein the first quantum dot layer is configured to absorb light in a first wavelength band, the second quantum dot layer is configured to absorb light in a second wavelength band different from the first wavelength band, and the third quantum dot layer is configured to absorb light in a third wavelength band different from the first wavelength band and the second wavelength band.

24. The photoelectric device of claim 23, wherein at least one of the first semiconductor layer, the second semiconductor layer, and the third semiconductor layer comprises an oxide semiconductor.

25. The photoelectric device of claim 23, wherein the first quantum dot layer is embedded in the first semiconductor layer.

26. An electronic apparatus comprising the photoelectric device of claim 23.

27. The photoelectric device of claim 23, wherein
the second photoelectric conversion element is disposed on a first region of the first photoelectric conversion element and third photoelectric conversion element is disposed on a second region of the first photoelectric conversion element, different from the first region, and
the first photoelectric conversion element has a width greater than a width of either of the second photoelectric conversion element and the third photoelectric conversion element.

28. The photoelectric device of claim 27, wherein
the first photoelectric conversion element is configured to absorb blue light,
the second photoelectric conversion element is configured to absorb red light, and
the third photoelectric conversion element is configured to absorb green light.

29. The photoelectric device of claim 23, wherein
the first photoelectric conversion element, the second photoelectric conversion element, and the third photoelectric conversion element form a stacked structure, and
the stacked structure has a hexagonal structure as viewed from above.

30. The photoelectric device of claim 29, wherein
each of the first electrode, the second electrode, the third electrode, the fourth electrode, the fifth electrode, and the sixth electrode is disposed at one of six sides of the hexagonal structure, and
the first electrode faces the second electrode, the third electrode faces the fourth electrode, and the fifth electrode faces the sixth electrode.

31. The photoelectric device of claim 23, wherein
the first photoelectric conversion element, the second photoelectric conversion element, and the third photoelectric conversion element form a stacked structure, and
the stacked structure has an octagonal structure as viewed from above.

32. The photoelectric device of claim 31, further comprising at least one of:
  a gate electrode provided between the first photoelectric conversion element and the second photoelectric conversion element and
  a gate electrode provided between the second photoelectric conversion element and the third photoelectric conversion element.

33. The photoelectric device of claim 32, further comprising at least one gate contact portion connected to the gate electrode, wherein
each of the first electrode, the second electrode, the third electrode, the fourth electrode, the fifth electrode, and the sixth electrode is disposed at one of six of eight sides of the octagonal structure, and
the at least one gate contact portion is disposed at a remaining two of the eight sides of the octagonal structure.

34. The photoelectric device of claim 23, further comprising a substrate, wherein the first to third photoelectric conversion elements are stacked sequentially on the substrate.

35. The photoelectric device of claim 34, further comprising at least one of:
  a first gate electrode disposed below the first photoelectric conversion element;
  a second gate electrode disposed between the first photoelectric conversion element and the second photoelectric conversion element; and
  a third gate electrode disposed between the second photoelectric conversion element and the third photoelectric conversion element.

36. The photoelectric device of claim 34, wherein
the first photoelectric conversion element has a first width,
the second photoelectric conversion element has a second width less than or equal to the first width, and
the third photoelectric conversion element has a third width less than or equal to the second width.

37. The photoelectric device of claim 34, wherein
the first photoelectric conversion element is configured to absorb light corresponding to one of red light, green light, blue light, and infrared light, the second photoelectric conversion element is configured to absorb light corresponding to one of the red light, green light, blue light, and infrared light, and the third photoelectric conversion element is configured to absorb light corresponding to one of the red light, green light, blue light, and infrared light.

38. The photoelectric device of claim 37, wherein
the first photoelectric conversion element is configured to absorb the red light,
the second photoelectric conversion element is configured to absorb the green light, and
the third photoelectric conversion element is configured to absorb the blue light.

39. The photoelectric device of claim 37, wherein
the first photoelectric conversion element is configured to absorb the blue light,
the second photoelectric conversion element is configured to absorb the red light, and
the third photoelectric conversion element is configured to absorb the green light.

40. A photoelectric device for converting optical energy into electrical energy, the photoelectric device comprising:
a photoactive layer comprising:
a quantum dot layer configured to generate an electric charge in response to light incident thereon, and
a semiconductor layer configured to conduct the electric charge generated by the quantum dot layer;
a first electrode electrically connected to a first end of the semiconductor layer; and
a second electrode electrically connected to a second end of the semiconductor layer,
wherein the photoactive layer is configured to absorb and detect visible light or light having higher wavelengths than the visible light,
wherein the semiconductor layer comprises an oxide semiconductor,
wherein the semiconductor layer has an energy band gap of 3.0 eV to 5.0 eV, and
wherein the semiconductor layer comprises a lower semiconductor layer and an upper semiconductor layer, and the quantum dot layer is disposed between the lower semiconductor layer and the upper semiconductor layer.

* * * * *